United States Patent
Cheded et al.

(10) Patent No.: US 10,345,354 B2
(45) Date of Patent: *Jul. 9, 2019

(54) FAULT DETECTION METHOD FOR A FLOW SENSOR AND A HEIGHT SENSOR FLUID TANK SENSOR NETWORK

(71) Applicant: KING FAHD UNIVERSITY OF PETROLEUM AND MINERALS, Dhahran (SA)

(72) Inventors: Lahouari Cheded, Dhahran (SA); Rajamani Doraiswami, Ottawa (CA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,213

(22) Filed: Jul. 30, 2018

(65) Prior Publication Data

US 2018/0364289 A1 Dec. 20, 2018

Related U.S. Application Data

(63) Continuation of application No. 15/888,446, filed on Feb. 5, 2018, now Pat. No. 10,067,174, which is a
(Continued)

(51) Int. Cl.
*G01R 31/02* (2006.01)
*H04W 84/18* (2009.01)
(Continued)

(52) U.S. Cl.
CPC ............ *G01R 31/02* (2013.01); *G01D 21/00* (2013.01); *G08C 25/00* (2013.01); *H04Q 9/00* (2013.01);
(Continued)

(58) Field of Classification Search
CPC .... G01R 31/02; H04Q 9/00; H04Q 2209/823; H04W 84/18; G01D 21/00; G08C 25/00
See application file for complete search history.

(56) References Cited

U.S. PATENT DOCUMENTS 7,280,941 B2 10/2007 Bonanni et al.
9,933,473 B2 4/2018 Cheded
(Continued)

OTHER PUBLICATIONS

Li Jiang; "Sensor Fault Detection and Isolation Using System Dynamics Identification Techniques"; Dissertation for Doctor of Philosophy (Mechanical Engineering) at the University of Michigan; 2011.
(Continued)

*Primary Examiner* — Toan M Le
(74) *Attorney, Agent, or Firm* — Oblon, McClelland, Maier & Neustadt, L.L.P.

(57) ABSTRACT

Discussed herein are a sensor-network system and a method thereof for detecting and isolating faults occurring in subsystems and sensors included in the network. The subsystems and the sensor measurements are subject to noise and disturbances. A bank of Kalman-filters (KF) is used to detect and isolate the faults. Each KF is driven by either a pair of consecutive sensor measurements or a pair including a reference input and a sensor measurement. The KF residual is computed for each measurement pair and is a reliable indicator of a fault in subsystems and sensors located in the network.

7 Claims, 10 Drawing Sheets

Related U.S. Application Data continuation of application No. 14/695,987, filed on Apr. 24, 2015, now Pat. No. 9,933,473.

(60) Provisional application No. 62/001,315, filed on May 21, 2014.

(51) Int. Cl.
*G01D 21/00* (2006.01)
*G08C 25/00* (2006.01)
*H04Q 9/00* (2006.01)

(52) U.S. Cl.
CPC ...... *H04W 84/18* (2013.01); *H04Q 2209/823* (2013.01)

(56) References Cited

U.S. PATENT DOCUMENTS

| | | | |
|---|---|---|---|
| 10,067,174 B2 * | 9/2018 | Cheded | G01R 31/02 |
| 2009/0043447 A1 | 2/2009 | Vershinin et al. | |
| 2019/0011490 A1 * | 1/2019 | Cheded | G01R 31/02 |

OTHER PUBLICATIONS

S. Simani, et al.; "Fault diagnosis in power plant using neural networks"; Elsevier Science Inc.; 2000; vol. 127; Issues 3-4; pp. 125-136.
Doraiswami, et al., Fault Diagnosis of a Sensor Network, 2012 IEEE, pp. 650-655.

* cited by examiner

FAULT DETECTION METHOD FOR A FLOW SENSOR AND A HEIGHT SENSOR FLUID TANK SENSOR NETWORK

CROSS-REFERENCE TO RELATED APPLICATIONS

The present application is a Continuation of Ser. No. 15/888,446, now allowed, having a filing date of Feb. 5, 2018, which is a Continuation of Ser. No. 14/695,987; now U.S. Pat. No. 9,933,473, having a filing date of Apr. 24, 2015, and which claims benefit of priority to U.S. provisional application No. 62/001,315, having a filing date of May 21, 2014 and which is incorporated herein by reference in its entirety.

FIELD OF DISCLOSURE

Embodiments described herein generally relate to fault-diagnosis mechanisms for a sensor network of a cascade, parallel and feedback combination of subsystems and sensors. Specifically, the embodiments described herein are directed to the detection and isolation of fault(s), based on Kalman filters, in any of the subsystems and sensors that are subject to disturbance and measurement noise.

DESCRIPTION OF THE RELATED ART

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

The practical importance of fault diagnosis, including fault detection and isolation (FDI), continues to gain interest by both industry and academia. Typically, FDI techniques are classified either as model-free or model-based techniques. Modern engineering systems are ever increasing in complexity and tend to be distributed over wide areas, thus relying on a network of sensors to collect the necessary data.

A sensor network (SN) includes spatially distributed sensors to monitor the status of a system, events phenomena, or environmental variables such as temperature, sound, vibration, pressure, motion, or the presence of harmful pollutants. The development of sensor networks using wireless or wired means and/or their combination is motivated by a wide variety of practical applications, including military applications such as battlefield surveillance, many industrial and civilian application areas, including industrial process monitoring and control, machine health monitoring, environment and habitat monitoring, healthcare applications, home automation, and traffic control. Furthermore, SN's are also used to monitor the integrity of a network of pipes carrying various fluids (water, oil, gas or other) and also find applications in target-tracking experiments. The advent and proliferation of both wireless sensors and embedded processors and the consequent deployment of intelligent sensors have undoubtedly been the key drivers behind the ever-increasing use of SNs.

Typical approaches for fault detection are based on generating a residual using a Kalman filter (KF), and using Bayes binary decision theory to assert the presence or absence of a fault. For fault isolation, Bayes' multiple hypotheses testing and a Bank of Kalman filters-based scheme are generally used. However, in these approaches each Kalman filter is driven with all the inputs (except one) of the system. A critical limitation in the widespread use of such techniques to detect (and isolate faults) is the large distance between the sensor nodes. For instance, the case wherein, the distance between two sensor nodes in a network is large, and a Kalman filter is activated with all the inputs of the network, may possibly lead to a faulty detection. Furthermore, activating each KF with all the inputs, poses memory limitations and speed limitations on a processor that performs computations to determine the location of faults within the network.

Accordingly, a framework that detects and isolates faults in a network in an efficient manner, wherein each Kalman filter is activated only by a pair of input measurements is desired, thereby reducing the computational complexity involved in determining the location of the faults within the network.

SUMMARY

The present disclosure provides a model-based approach to develop a fault diagnosis scheme for a sensor network that includes a cascade, parallel and feedback combination of subsystems. The model described herein detects and isolates a fault in any of the subsystems and measurement sensors that are subject to disturbances and/or measurement noise. A bank of Kalman filters (KF) is employed to detect and isolate faults. Each KF is driven by either a pair of consecutive sensor measurements or, a pair of a reference input and a sensor measurement. Accordingly, a KF residual is shown to be a reliable indicator of a fault in the subsystems and sensors located in the path between the pair of the KF's inputs used. The fault diagnosis procedure described herein analyzes each of the associated paths and leads to both the detection and isolation of any fault that occurs in the analyzed paths. According to one embodiment, the fault detection and isolation technique described herein is successfully evaluated on several simulated scenarios including a physical fluid system (two-tank system) in order to detect and isolate faults including sensor faults, actuator faults and leakage faults.

According to one embodiment, the Kalman filer residual is an indicator of a fault in both the subsystems and sensors located in the path between the pair of the KF's inputs used. Bayes decision strategy is further used to assert the presence or absence of a fault. The subsystems and sensors located in the path between the pair of inputs driving the KFs whose residuals are used to assert the presence of a fault, are assigned 'binary 1's' while the subsystems and sensors located in other paths are assigned 'binary 0's'. Thus the physical system formed of all subsystems and sensors used is transformed into an equivalent binary tree that is governed by a truth table from which tree branches containing faulty subsystems and sensors are identified and the faulty elements, both detected and isolated using binary logic. Further, according to another embodiment, multiple faults in either sensors or subsystems are successfully isolated as long as both sensor and subsystem faults do not occur simultaneously. A fault in a subsystem or in a sensor is cross-checked by analyzing different paths between sensor nodes, thereby increasing the reliability of the fault detection mechanism.

Accordingly, an embodiment of the present disclosure provides a method for detecting and isolating faults in a sensor network including a plurality of sub-systems. The method includes: receiving, by a processing circuit, a plurality of signal measurement pairs in the sensor network, wherein each signal measurement pair corresponds to a path in the sensor network, and using these measurement pairs to drive a Kalman-filters corresponding to the paths in the sensor network; computing, by the processing circuit, a Kalman-filter residual for each signal measurement pair, wherein the Kalman-filter residual indicates the presence of a fault on the path corresponding to the analyzed signal measurement pair; assigning for each signal measurement pair, a binary-detection value for each sensor and sub-system lying on the path corresponding to the signal measurement pair, based on the computed Kalman-filter residual and a predetermined threshold corresponding to the signal measurement pair; and computing, by the processing circuit, a binary-decision value for each sensor and sub-system in the sensor network, by performing a logical-AND operation of the assigned binary-detection values of the sensors and sub-systems.

Another embodiment provides for a sensor-network system including a plurality of sub-systems and sensors and a processing circuit. The processing circuit is configured to: receive a plurality of signal measurement pairs in the sensor network, wherein each signal measurement pair corresponds to a path in the sensor network, with each pair driving a Kalman-filter corresponding to its own, path in the sensor network; compute a Kalman-filter residual for each signal measurement pair, wherein the Kalman-filter residual indicates the presence of a fault on the path corresponding to the signal measurement pair; assign for each signal measurement pair, a binary-detection value for each sensor and sub-system lying on the path corresponding to the signal measurement pair, based on the computed Kalman-filter residual and a predetermined threshold corresponding to the signal measurement pair; and compute by the processing circuit, a binary-decision value for each sensor and sub-system in the sensor network, by performing a logical-AND operation of the assigned binary-detection values of the sensors and sub-systems.

Another embodiment provides a non-transitory computer readable medium having stored thereon a program that when executed by a computer causes the computer to execute a method of detecting and isolating faults in a sensor network including a plurality of sub-systems. The method includes: receiving, by a processing circuit, a plurality of signal measurement pairs in the sensor network, wherein each signal measurement pair corresponds to a path in the sensor network, with each pair driving a Kalman-filter corresponding to the path in the sensor network; computing, by the processing circuit, a Kalman-filter residual for each signal measurement pair, wherein the Kalman-filter residual indicates the presence of a fault on the path corresponding to the signal measurement pair; assigning for each signal measurement pair, a binary-detection value for each sensor and sub-system lying on the path corresponding to the signal measurement pair, based on the computed Kalman-filter residual and a predetermined threshold corresponding to the signal measurement pair; and computing, by the processing circuit, a binary-decision value for each sensor and sub-system in the sensor network, by performing a logical-AND operation of the assigned binary-detection values of the sensors and sub-systems.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Kalman filtering (also referred to herein as linear quadratic estimation (LQE) technique), uses a series of measurements observed over time, containing noise (random variations) and other inaccuracies, and produces estimates of unknown variables that tend to be more precise than those based on a single measurement alone. More formally, a Kalman filter operates recursively on streams of noisy input data to produce a statistically-optimal estimate of the underlying system state.

Figure 1:
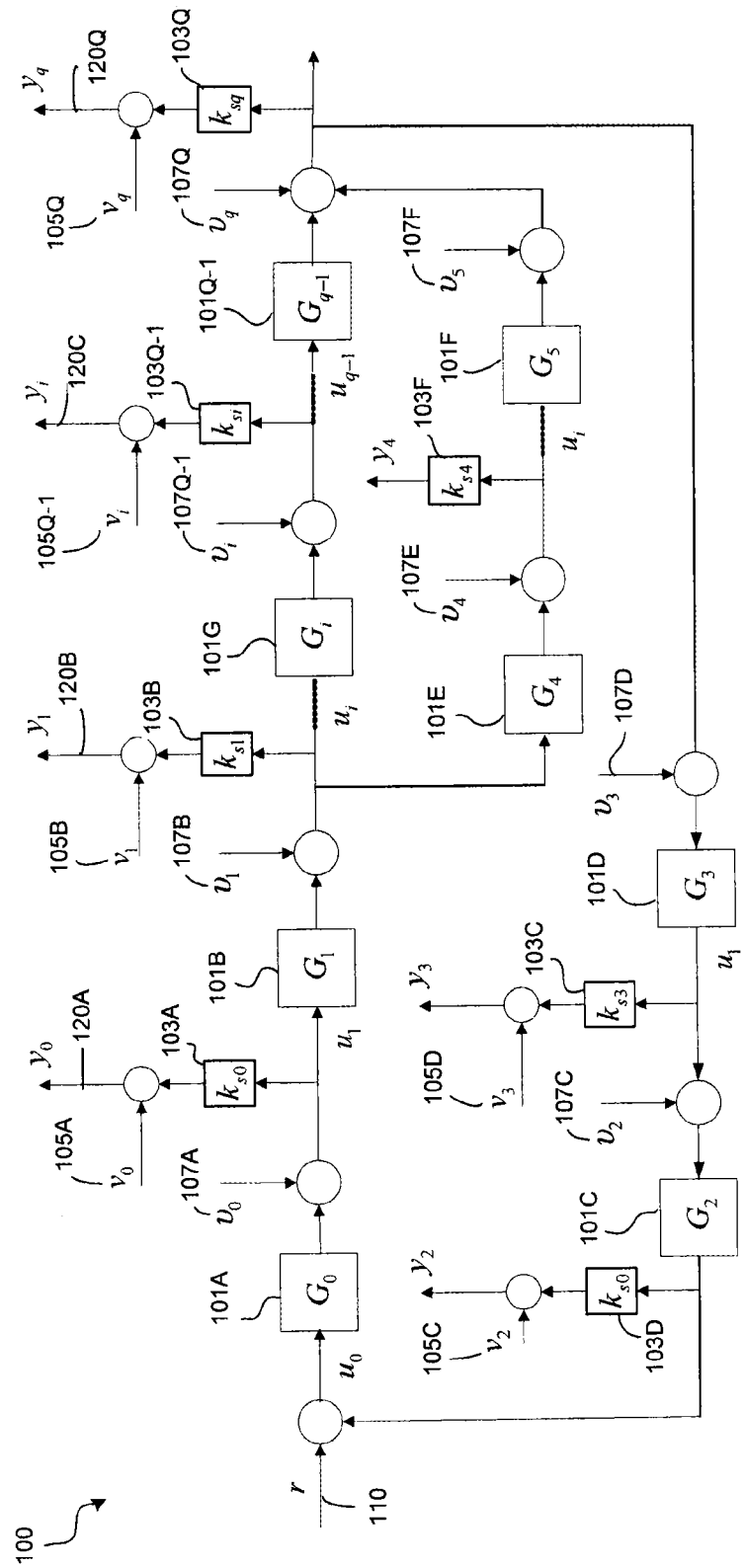
FIG. 1 depicts an exemplary sensor network formed by an interconnection of sub-systems.

FIG. 1 depicts according to one embodiment, an exemplary network (system) 100 that includes an interconnection of sub-systems and sensors. The sensor network 100 includes a cascade, parallel and feedback combinations of q sub-systems $G_i$, represented as 101A-101Q, whose individual inputs are represented as $u_i$. Each subsystem may correspond to a physical entity such as a sensor, an actuator, a controller or other system component that is subject to variations, and may be affected by noise or disturbance. In FIG. 1, the sensors are modeled by a set of gains $\{k_{si}\}$ represented as 103A-103Q. The sensors are affected by additive measurement noise signals $\{v_i\}$, represented as 105A-105Q. The sub-systems may also be subjected to noise and disturbances $\{v_i\}$ that are represented as 107A-107Q. The system 100 is driven by a reference input r, 110. As stated previously, a bank of Kalman filters is employed to detect and isolate faults that may potentially occur in the system 100. Each KF is driven by either a pair of consecutive sensor measurements ($y_i$) or, a pair of a reference input (r) and a sensor measurement. The reference input is represented as 110, whereas the sensor measurements are represented as 120A-120Q. Therefore, as described below, by driving each Kalman filter by a pair of inputs, (as opposed to all inputs), the processing complexity involved in determining a fault location is reduced.

In what follows, the fault diagnosis scheme developed according to an embodiment of the present disclosure is described with reference to FIG. 2.

Figure 2:
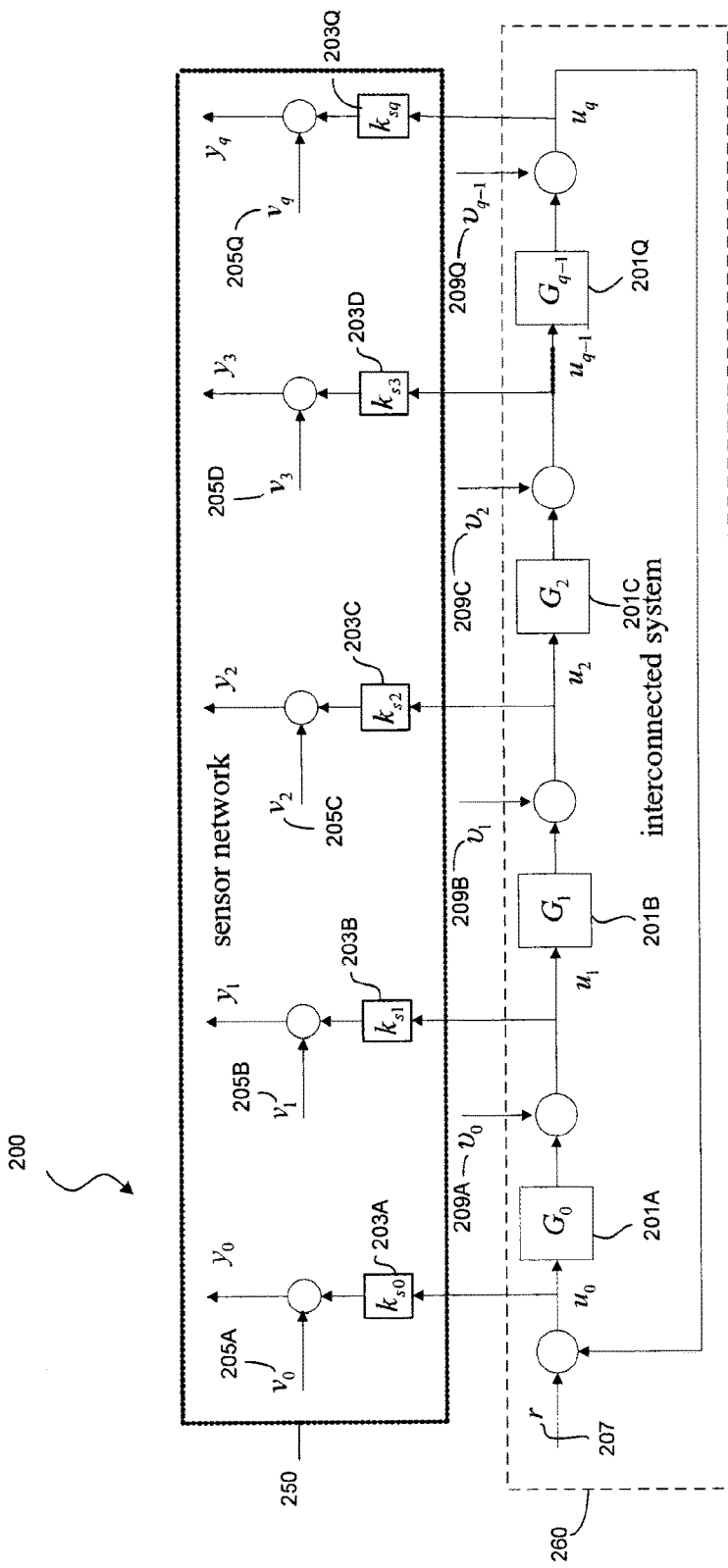
FIG. 2 illustrates a closed loop feedback sensor network according to one embodiment.

FIG. 2 illustrates a closed-loop feedback sensor network 200 according to one embodiment. The sensor network 200 includes a sensor network portion 250 and an interconnected system 260. The interconnected system 260 includes a cascade of sub-systems $G_i$: i=0, 1, 2, . . . q in the forward path, represented as 201A 201Q. The interconnected system has a reference input r, 207. The sub-systems 201A-201Q may be subjected to noise and disturbances that are represented as $\{v_i\}$ and labelled as 209A-209Q.

The sensor network 250 includes a plurality of sensors that are modeled by a set of sensor gains $\{k_{si}\}$, represented as 203A-203Q. The additive noise signals affecting the sensors is represented as $\{v_i\}$, and labelled as 205A-205Q. According to one embodiment, both simple and multiple faults, i.e. at any time instant more than one subsystem or sensor may be faulty are considered. The objective is two-fold, i.e., to detect whether there is a fault in the sensor network and if there is a fault detected, to indicate which sub-system or which sensor is faulty. The subsystem $G_i$ is in general a dynamical system while the sensors are modeled as static gains $k_{si}$. Accordingly, an integrated model-based and model-free approach is employed for fault diagnosis. In the model-based scheme, a bank of Kalman filters is employed for detecting faults in the system. In one embodiment, a suboptimal, instead of the optimal time-varying, Kalman filter is employed using the steady-state optimal Kalman gain. The Kalman filter is designed for the nominal fault-free model of the sensor network shown in FIG. 2. The residuals of the Kalman filters are generated from all possible pairs of (a) sensor measurements $\{y_i(k), y_j(k)\}$ with $y_i(k)$ as input and $y_j(k)$ as the desired output as well as (b) the reference input and measurements $\{r(k), y_j(k)\}$ with $r(k)$ as the input and $y_j(k)$ as the desired output. The pairs in (a) and (b) listed above are associated respectively with the forward and feedback paths of the closed-loop sensor network.

According to one embodiment, the Kalman filter using the pair $\{y_i(k), y_j(k)\}$ is governed by the following equations:

$$\hat{x}_{ij}(k+1) = A_{ij}^0 \hat{x}_{ij}(k) + B_{ij}^0 y_i(k) + K_{ij}^0 (y_j(k) - C_{ij}^0 \hat{x}_{ij}(k))$$

$$e_{ij}(k) = y_j(k) - C_{ij}^0 \hat{x}_{ij}(k) \tag{1}$$

where $e_{ij}(k)$ is the residual; $K_{ij}^0$ is the nominal Kalman gain, $(A_{ij}^0, B_{ij}^0, C_{ij}^0)$ is the state-space model of the system formed of subsystems and sensors located between the measurement nodes of $y_i(k)$ and $y_j(k)$, i.e.:

$$x_{ij}(k+1) = A_{ij}^0 x_{ij}(k) + B_{ij}^0 y_i(k) + \begin{bmatrix} B_{ij}^0 & E_{ij}^0 \end{bmatrix} \begin{bmatrix} v_i(k) \\ w_{ij}(k) \end{bmatrix} \tag{2}$$

$$y_j(k) = C_{ij}^0 x_{ij}(k) + v_j(k)$$

The state-space model $(A_{ij}^0, B_{ij}^0, C_{ij}^0)$ is assumed to be observable and is derived from the transfer function that relates $y_i(k)$ and $y_j(k)$. The parameter $x_{ij}(k)$ is the estimate at step k of the Kalman filter. Observability of a system is a measure of how well the internal state of the system can be inferred by the knowledge of the outputs of the system. Specifically, a map relating $y_i(z)$ to $y_j(z)$ can be obtained as follows:

The map relating $u_j(z)$ and $u_i(z)$ is given by:

$$u_j(z) = \left(\prod_{l=i}^{j-1} G_l(z)\right) u_i(z) + v_{ij}(z) \text{ where} \tag{3}$$

$$v_{ij}(z) = \tag{4}$$
$$\left(\prod_{l=i+1}^{j-1} G_l(z)\right) v_i(z) + \left(\prod_{l=i+2}^{j-1} G_l(z)\right) v_{i+1}(z) + \ldots + G_{j-1} v_{j-2}(z) + v_{j-1}(z)$$

Since $$u_i(z) = \frac{y_i(z) - v_i(z)}{k_{si}},$$

substituting for $u_i(z)$ yields:

$$u_j(z) = \frac{1}{k_{si}} \left(\prod_{l=i}^{j-1} G_l(z)\right) y_i(z) - \frac{1}{k_{si}} \left(\prod_{l=i}^{j-1} G_l(z)\right) v_i(z) + v_{ij}(z) \tag{5}$$

From FIG. 2, it can be inferred that $y_j(z) = k_{sj} u_j(z) + v_j(z)$. Combining this expression with (5) leads to the following expression relating $y_j(z)$ to $y_i(z)$ and the new noise term $v_{ij}(z)$ as defined below:

$$y_j(z) = \frac{k_{sj}}{k_{si}} \left(\prod_{l=i}^{j-1} G_l(z)\right) y_i(z) + v_{ij}(z) \text{ where} \tag{6}$$

$$v_{ij}(z) = -\frac{k_{sj}}{k_{si}} \left(\prod_{l=i}^{j-1} G_l(z)\right) v_i(z) + k_{si} v_{ij}(z) + v_j(z).$$

Note that in equation (2), $w_{ij}(k)$ is, in general, a vector of the disturbances, $E_{ij}^0$ is a matrix indicating the entry points of the disturbances, $v_{ij}$ depicts the effect of the disturbances $w_{ij}(k)$ and the measurement noises $v_i$ and $v_j$ that affect the output $y_j$.

According to another embodiment, the Kalman filter using the reference input-measurement pair $\{r(k), y_j(k)\}$ is given by:

$$\hat{x}_{rj}(k+1) = A_{rj}^0 \hat{x}_{rj}(k) + B_{rj}^0 r(k) + K_{rj}^0 (y_j(k) - C_{rj}^0 \hat{x}_{ij}(k))$$

$$e_{rj}(k) = y_j(k) - C_i^0 \hat{x}_{rj}(k) \tag{7}$$

where $e_{rj}(k)$ is the residual; $K_{rj}^0$ the Kalman gain and the triplet $(A_{rj}^0, B_{rj}^0, C_{rj}^0)$ the state-space model of the system formed of subsystems and sensors located between the measurement nodes of $r(k)$ and $y_j(k)$, and is assumed to be observable. Similar to equation (2), the state-space model $(A_{ij}^0, B_{ij}^0, C_{ij}^0)$ given below in equation (8) is derived from the transfer function of equation (9) that relates $r(k)$ and $y_j(k)$ $$x_{rj}(k+1) = A_{rj}^0 x_{rj}(k) + B_{rj}^0 r(k) + E_{rj}^0 w_{rj}(k) \tag{8}$$

$$y_j(k) = C_{rj}^0 x_{rj}(k) + v_j(k)$$

$$y_j(z) = k_{sj} \left( \frac{\prod_{l=0}^{i} G_l(z) r(z)}{1 + \prod_{l=0}^{q-1} G_l(z)} \right) + v_{rj}(z) \tag{9}$$

where $v_{rj}(z) = v_j(z) + k_{sj} v_{rj}(z)$ and where $w_{rj}(k)$ is, in general, a vector of the disturbances, $E_{rj}^0$ is a matrix indicating the entry points of the disturbances, $v_{rj}$ represents the effect of the disturbances $w_{rj}(k)$ and the measurement noise $v_j$ affecting the output $y_j$.

Equation (9) can be derived as follows: referring to FIG. 2 and using the superposition principle, the closed-loop system output $u_j$ can be expressed as the sum of the outputs due to the reference input and the noise inputs $\upsilon_i$, i=0, 1, 2, ... q−1, applied separately. Consider the output $u_j(z)$ due only to the reference input r. Using the property of cascade and feedback combinations of the transfer functions $G_i(z)$, i=0, 1, 2, ... q−1, the output due only to r and denoted by $i_{jr}(z)$ is $$u_{jr}(z) = \frac{\prod_{l=0}^{j-1} G_l(z) r(z)}{1 + \prod_{l=0}^{q-1} G_l(z)} \tag{10}$$

In order to derive the output, denoted by $u_{ji}$, which is due to the $i^{th}$ input noise component $\upsilon_i$ only, we need to first set all other input noise components $\upsilon_j$, j≠i to zero. Next by simply re-drawing the closed loop of FIG. 2 in such a way that $\upsilon_i$ becomes the reference input (in place of r) and $u_{ji}(z)$ the system output (instead of $u_q$), then the expression of the output $u_{ji}$ due to the $i^{th}$ input noise component $\upsilon_i$ only, can be readily derived in a similar way to that of (10), and is given below as:

$$u_{ji}(z) = \frac{\left(\prod_{l=i+1}^{j-1} G_l(z)\right) \upsilon_i(z)}{1 + \prod_{l=0}^{q-1} G_l(z)} \tag{11}$$

The individual outputs $(u_{jk}(z), k \neq i)$ due to each of the remaining (q−1) input noise components can be obtained in a similar way to that of (11). Superposing the individual outputs due to the reference input r on the one hand, and to each of the q noise components, $\upsilon_i$, i=0, 1, 2, ... q−1, on the other, as given by (10) and (11) respectively, yields the following expression for the total input:

$$u_j(z) = u_{jr}(z) + \sum_{i=0}^{q-1} u_{ji}(z) = \frac{\prod_{l=0}^{j-1} G_l(z) r(z) + \sum_{i=0}^{q-1} \prod_{l=i+1}^{j-1} G_l(z) \upsilon_i(z)}{1 + \prod_{l=0}^{q-1} G_l(z)} \tag{12}$$

$$= \frac{\prod_{l=0}^{j-1} G_l(z) r(z)}{1 + \prod_{l=0}^{q-1} G_l(z)} + \upsilon_{rj}(z)$$

where $\upsilon_{rj}(z) = \dfrac{\sum_{i=0}^{q-1} \prod_{l=i+1}^{j-1} G_l(z) \upsilon_i(z)}{1 + \prod_{l=0}^{q-1} G_l(z)}$.

Thus, by using the relation between $y_j$ and $u_j$, namely $y_j = k_{sj} u_j + v_j$, the expression as shown in equation (9) can be obtained.

According to one embodiment of the present disclosure, the residual generated by the Kalman filter, which is used for a particular pair of nodes can be expressed in terms of its associated model mismatch term $\Delta G(z) = G_0(z) - G(z)$, where $G_0(z)$ and $G(z)$ respectively correspond to the actual and the nominal transfer functions of the system for that particular pair of nodes. In what follows, the expressions of the residuals are derived for the two pairs described in the disclosure, namely a pair of measurements and a reference input-measurement pair. In the derivation described below, an expression for the residual of a Kalman filter where the actual model of the system deviates from its nominal model (fault-free), in a general setup is first described. The results are applied to obtain the fault diagnosis of a sensor network.

Let (A,B,C) be the true state-space system model (or equivalent transfer function model $G(z) = N(z)/D(z)$) that generates the system output $y(k)$, and let $(A_0, B_0, C_0)$ be the nominal or fault-free system model (or equivalent nominal transfer function model $G_0(z) = N_0(z)/D_0(z)$). The system is affected by a disturbance $w(k)$ and a measurement noise $v(k)$, which are both assumed to be zero-mean white noise processes. A model mismatch occurs if the nominal Kalman filter (KF) model $(A_0, B_0, C_0)$ differs from the true system model (A,B,C). An expression for the residual, denoted by $e(z)$, is derived in terms of the model mismatch term $\Delta G(z) = G_0(z) - G(z)$. Note that in the above description the parameter $N(z)$ corresponds to the numerator and the parameter $D(z)$ corresponds to the denominator of the transfer function.

The Kalman filter for the nominal system $(A_0, B_0, C_0)$ is given by:

$$\hat{x}(k+1) = (A_0 - K_0 C_0)\hat{x}(k) + B_0 r(k) + K_0 y(k)$$

$$e(k) = y(k) - C_0 \hat{x}(k) \tag{13}$$

where $(A_0, B_0, C_0)$ is the nominal value of (A,B,C), and $e(k)$ is the residual. Expressing this model in the frequency domain yields:

$$\hat{x}(z) = (zI - A_0 + K C_0)^{-1} B_0 r(z) + (zI - A_0 + K_0 C_0)^{-1} K_0 y(z)$$

$$e(z) = y(z) - C_0 \hat{x}(z) \tag{14}$$

By expressing the residual $e(z)$ in terms of $r(z)$ and $y(z)$ we get:

$$e(z) = (I - C_0(zI - A_0 + K_0 C_0)^{-1} K_0) y(z) - C_0(zI - A_0 + K_0 C_0)^{-1} B_0 r(z) \tag{15}$$

Assume that the actual model of the system is denoted by the triplet (A,B,C). Thus, we have $$x(k+1) = Ax(k) + Br(k) + Ew(k)$$

$$y(k) = Cx(k) + \upsilon(k) \tag{16}$$

The frequency-domain expression that relates the output y to the input r, the disturbance w and measurement noise $\upsilon$ becomes:

$$y(z) = G(z) r(z) + v(z) \text{ where} \tag{17}$$

$$G(z) = \frac{N(z)}{D(z)} = C(zI - A)^{-1} B \text{ and}$$

$$v(z) = C(zI - A)^{-1} Ew(z) + \upsilon(z).$$

Accordingly, the residual of the Kalman filter can be expressed as:

$$e(z) = \frac{D_0(z)}{F_0(z)}y(z) - \frac{N_0(z)}{F_0(z)}r(z) \text{ where} \quad (18)$$

$$\frac{D_0(z)}{F_0(z)} = I - C_0(zI - A_0 + K_0C_0)^{-1}K_0 \text{ and}$$

$$\frac{N_0(z)}{F_0(z)} = C_0(zI - A_0 + K_0C_0)^{-1}B_0$$

In order to prove the above equation (18), we make use of the following matrix identity:

$$(C(zI - A)^{-1}B + D)^{-1} = \frac{\left\| \begin{matrix} zI - A & B \\ -C & D \end{matrix} \right\|}{|zI - A|} \quad (19)$$

where |(.)| denotes determinant of (.), A is an (n×n) matrix, B is an (n×1) column vector, C is an (1×n) row vector, and D is a scalar, Consider the term: $I - C_0(zI - A_0 + K_0C_0)^{-1}K_0$. Using the matrix identity given by equation (19) we get:

$$I - C_0(zI - A_0 + K_0C_0)^{-1}K_0 = \frac{\left\| \begin{matrix} zI - A_0 + K_0C_0 & K_0 \\ C_0 & I \end{matrix} \right\|}{|zI - A_0 + K_0C_0|} \quad (20)$$

Consider the square bracket on the upper right-hand side of (20). As the determinant does not change by elementary operations on its rows and columns, post-multiplying the second row by $K_0$ and adding it to the first row yields:

$$I - C_0(zI - A_0 + K_0C_0)^{-1}K_0 = \frac{\left\| \begin{matrix} zI - A_0 & 0 \\ C_0 & I \end{matrix} \right\|}{|zI - A_0 + K_0C_0|} \quad (21)$$

$$I - C_0(zI - A_0 + K_0C_0)^{-1}K_0 = \frac{D_0(z)}{F_0(z)} \quad (22)$$

where $D_0(z) = |zI - A_0|$, $F_0(z) = |zI - A_0 + K_0C_0|$. Consider the scalar matrix $C_0(zI - A_0 + K_0C_0)^{-1}B_0$. Using the matrix identity of (19) we get:

$$C_0(zI - A_0 + K_0C_0)^{-1}B_0 = \frac{\left\| \begin{matrix} zI - A_0 + K_0C_0 & B_0 \\ C_0 & 0 \end{matrix} \right\|}{|zI - A_0 + K_0C_0|} \quad (23)$$

Consider now the upper term in the square bracket on the right-hand side. Again, as the determinant does not change by elementary operations on its rows and columns, post-multiplying the second row by $K_0$ and subtracting it from the first row, yields $$C_0(zI - A_0 + K_0C_0)^{-1}B_0 = \frac{\left\| \begin{matrix} zI - A_0 & B_0 \\ C_0 & 0 \end{matrix} \right\|}{|zI - A_0 + K_0C_0|} \quad (24)$$

$$C_0(zI - A_0 + K_0C_0)^{-1}B_0 = \frac{N_0(z)}{F_0(z)} \text{ where} \quad (25)$$

$$N_0(z) = \left\| \begin{matrix} zI - A_0 & B_0 \\ C_0 & 0 \end{matrix} \right\|.$$

Substituting equations (22) and (25) in the expression for the residual, i.e. equation (15), we obtain equation (18).

According to one embodiment, the residual of the Kalman filter takes the form:

$$e(z) = F_0^{-1}(z)D_0(z)[\Delta Gr(z) + v(z)] \quad (26)$$

where $G(z) = D(z)^{-1}N(z) = C(zI - A)^{-1}B$; $G_0(z) = C_0(zI - A_0)^{-1}B_0 = D_0^{-1}(z)N_0(z)$; $\Delta G = G(z) - G_0(z)$ is the deviation of the system model G(z) from its nominal model, $G_0(z)$. Consider the expression for the residual given in (18). Replacing y(z) by its expression of (17) in (18) and simplifying the result, we get:

$$e(z) = \frac{D_0(z)}{F_0(z)}\{\Delta G(z)r(z) + v(z)\} \text{ where} \quad (27)$$

$$\Delta G(z) = G(z) - G_0(z) = \frac{N(z)}{D(z)} - \frac{N_0(z)}{D_0(z)}.$$

Thus, we have:

$$F_0(z) = \det(zI - A_0 + K_0C_0) \quad (28)$$

$$v(z) = C(zI-A)^{-1}Ew(z) + [C(zI-A)^{-1}K+I]\upsilon(z) \quad (29)$$

Rewriting (27) as a sum of the model mismatch term $e_f(z)$ and a noise term $e_0(z)$ yields $$e(z) = e_f(z) + e_0(z) \quad (30)$$

where $$e_f(z) = \Delta G(z)(F_0^{-1}(z)D_0(z)r(z)) \quad (31)$$

$$e_0(z) = F_0^{-1}(z)D_0(z)v(z) \quad (32)$$

$e_f(z)$ and $e_0(z)$ are the filtered reference input and noise, respectively, with the filter's transfer function being given by $F_0^{-1}(z)D_0(z)$. Thus the residual e(z) is the sum of two components, one of which ($e_f(z)$) is deterministic and the other ($e_0(z)$) stochastic. Therefore the residual e(z) will inherit its statistical characterization directly from its noisy component, $e_0(z)$, which is assumed to be normally distributed. The deterministic component $e_f(z)$ is a function of the model mismatch $\Delta G(z)$ and hence is termed herein as the model-mismatch indicator. The model-mismatch indicator expresses the deviation in the output of the system, caused by a fault-induced perturbation in the system model, and hence is employed herein to monitor the status of the system. Therefore, if there is a model mismatch, the residual signal e(k) would be a normally-distributed stochastic process with a non-zero mean value $e_f(k)$.

According to one embodiment, the expected final (or steady-state) value of the residual is zero if and only if there is no model mismatch, i.e.:

$$\lim_{k \to \infty} E[e(k)] = 0 \text{ if and only if } \Delta G = 0 \quad (33)$$

and the residual is a zero-mean white noise process if and only if there is no model mismatch and the gain K of the Kalman filter is optimal, i.e.:

$$E[e(k)e(k-m)] = \sigma_e^2 \delta(m) = \begin{cases} \sigma_e^2 & m = 0 \\ 0 & \text{else} \end{cases} \quad (34)$$

if and only if ΔG=0 and the Kalman gain K is optimal, where m is the time lag and $\sigma_e^2=E[e^2(k)]$. Therefore, the residual for a pair of measurements $\{y_i(k), y_j(k)\}$ can be decomposed into 2 terms: A deterministic fault (or model mismatch)-indicator term (with the subscript 'f') and a noise term (with the subscript '0'), as shown below:

$$e_{ij}(z) = e_{fij}(z) + e_{0ij}(z) \qquad (35)$$

$$e_{fij}(z) = \Delta G_{ij}(z)(F_{ij0}^{-1}(z)D_{ij0}(z)y_i(z)) \qquad (36)$$

$$e_{0ij}(z) = F_{ij0}^{-1}(z)D_{ij0}(z)v_{ij}(z) \text{ where} \qquad (37)$$

$$\Delta G_{ij}(z) = \left(\frac{k_{sj}^0}{k_{si}^0}\right)\left(\prod_{l=1}^{j-1} G_l^0(z)\right) - \left(\frac{k_{sj}}{k_{si}}\right)\left(\prod_{l=1}^{j-1} G_l(z)\right),$$

$G_l^0(z)$ and $k_{sj}^0$ are the nominal subsystem and the sensor gain respectively. Alternatively, for the reference input-measurement pair, we have:

$$e_{rj}(z) = e_{frj}(z) + e_{0rj}(z) \qquad (38)$$

$$e_{frj}(z) = \Delta G_{rj}(z)(F_{rj0}^{-1}(z)D_{rj0}(z)r(z)) \qquad (39)$$

$$e_{0rj}(z) = F_{rj0}^{-1}(z)D_{rj0}(z)v_{rj}(z) \qquad (40)$$

Note that $e_{fij}(z)(e_{frj}(z))$ and $e_{0ij}(z)(e_{0rj}(z))$ are the filtered versions of the input and the noise, respectively, where the filter's transfer function is given by $F_0^{-1}(z)D_0(z)$. Thus the residual $e_{ij}(z)(e_{rj}(z))$ is the sum of two components, one of which $e_{fij}(z)(e_{fij}(z))$ is the model-mismatch indicator and the other $e_{0ij}(z)(e_{0rj}(z))$ is assumed to be a zero-mean white noise process. The model-mismatch indicator is the deviation in the output of the system, caused by a fault-induced perturbation in the system model, and hence is employed herein to monitor the status of the system.

Additionally, The model mismatch indicator $e_{fij}(z)(e_{fij}(z))$ is zero if and only if there is no fault. If there is a fault, the mismatch indicator will belong to the same class as that of the reference input signal. For example, it will be constant, a sinusoid and a colored noise respectively, if the reference input is constant, a sinusoid and a colored noise. Furthermore, according to another embodiment, the auto-correlation of the residual $e_{ij}(z)(e_{rj}(z))$ is a better visual indicator than the residual as the correlation operation attenuates the noise component and shows clearly the characteristics of the auto correlation of the mismatch indicator. In there is no fault, the auto-correlation of the residual will be a delta function. In the faulty case, the auto correlation of $e_{ij}(z)(e_{rj}(z))$ will not be a delta function. For example, the auto correlation function may be for instance, a triangular with a peak value at the zero lag for constant input, a sinusoid for a sinusoid input, and an impulse response of the coloring filter for colored noise reference input.

According to an embodiment of the present disclosure, faults in subsystems and sensors are effectively detected and isolated using Bayes decision strategy. Let $H_0^{rj}(H_0^{ij})$ and $H_1^{rj}(H_1^{ij})$ be two hypotheses indicating respectively, the presence and absence of a fault. The Bayes decision strategy then takes the general form:

$$t_s(e)\begin{cases} \leq \eta & \text{no fault} \\ > \eta & \text{fault} \end{cases} \qquad (41)$$

where $t_s(e)$ is the test statistics of the residual e and η is the threshold value computed, taking into account the variance of the noise term $e_0(k)$, prior probabilities of the two hypotheses, the cost associated with correct and wrong decisions, and the probability of a false alarm. Alternatively, the test statistics for a reference input r(k) that is either a constant or a sinusoid of frequency $f_0$ or an arbitrary signal can be expressed as:

$$t_s(e) = \begin{cases} \left|\frac{1}{N}\sum_{i=k-N+1}^{k} e(i)\right| & r(k) = \text{constant} \\ P_{ee}(f_0) & r(k) \text{ is a sinusoid} \\ \frac{1}{N}\sum_{i=k-N+1}^{k} e^2(i) & r(k) \text{ is an arbitrary signal} \end{cases} \qquad (42)$$

where $P_{ee}(f_0)$ is the power spectral density of the sinusoid. Therefore, Bayes decision strategies for the reference input-measurement pair and the measurement-measurement pair take the following respective forms:

$$t_s(e_{rj})\begin{cases} \leq \eta_{rj} & \text{decide } H_0^{rj}: \text{ no fault} \\ > \eta_{rj} & \text{decide } H_1^{rj}: \text{ fault} \end{cases} \qquad (43)$$

$$t_s(e_{ij})\begin{cases} \leq \eta_{ij} & \text{decide } H_0^{ij}: \text{ no fault} \\ > \eta_{ij} & \text{decide } H_1^{ij}: \text{ fault} \end{cases} \qquad (44)$$

In order to detect simple or multiple faults and isolate the faulty subsystem (s) and sensor(s), a binary logic approach is employed. If hypothesis $H_0^{rj}$ or $H_0^{ij}$ is true from (43) or (44), respectively, then all the components located in the path between the pair of nodes are assigned a binary zero indicating none of the components is faulty. The hypotheses are then treated as false and denoted by a zero, i.e., $H_0^{rj}=0$ or $H_0^{ij}=0$. If hypothesis $H_1^{rj}$ or $H_1^{ij}$ is true, then at least one component is faulty. This is indicated by assigning a binary one to all the components located in the path. The hypotheses are then treated as true and denoted by a one, i.e., $H_1^{rj}=1$ or $H_1^{ij}=1$. Furthermore, components, which are not located in the path between the pair of nodes, are assigned a 'don't care' character x, which can assume either 0 or 1.

Based on the above convention, according to an embodiment, a truth table can then be derived whose columns indicate the components under test and whose rows indicate the status of the fault at these components. The derivation of such a table is described later with reference to FIG. 3. In what follows, the types of faults detectable are first described, followed by a description of the generation of the truth tables.

According to one embodiment, simple faults that may occur in both subsystems and sensor, wherein only one component may be faulty at any one time is detectable. Specifically, if there are q subsystems, $G_i$, i=0, 1, 2, ..., q−1, in a sensor network, then a single fault occurring in any one of the q subsystems at any one time can be detected and isolated. Alternatively, if there are (q+1) sensors, $k_{si}$, i=0, 1, 2, ..., q, in a sensor network, then a single fault occurring in any one of the (q+1) any one time can be detected and isolated.

According to one embodiment, multiple faults in sensors (subsystems) with no fault in any subsystems (sensors). Specifically, if there are (q+1) sensors, $k_{si}$, i=0, 1, 2, ..., q, then provided there are no faults in the subsystems $G_i$ i=0, 1, 2, ... q−1, then multiple faults occurring simultaneously in any subset of sensors, of size i with 1≤i≤(q+1) can be detected and isolated. Alternatively, if there are q subsystems, then $G_i$, i=0, 1, 2, ..., (q−1), then, provided there are no faults the sensors used, i.e. $k_{si}$, i=0, 1, 2, ..., q, then multiple faults occurring simultaneously in any subset of the subsystems, of size i with 1≤i≤q can be detected and isolated. In the above-described types of faults that are detectable, the following assumptions are taken into account: (a) the reference input must be persistently exciting in order to excite all the modes of the subsystems so that all types of faults resulting from variations in the subsystem parameters may be detected. For example, a constant or sinusoidal reference input can only detect a fault resulting from variations in the steady-state gain or gain at the input frequency, (b) a sensor and a subsystem cannot be faulty at the same time, and (c) multiple faults: more than one sensor can be faulty if none of the subsystem is faulty and more than one subsystem can be faulty if none of the sensor is faulty. Note however, that in the case of single or multiple sensor fault (in the absence of any subsystem fault) there is redundancy in the sensor fault isolation phase as faults are decided by analyzing separate residuals associated with (a) pairs of relevant measurements, and (b) the pairs made of the reference input and relevant measurements. Hence these two separate decisions may be cross-checked for accuracy by verifying whether both analyses yield the same results.

Figure 3:
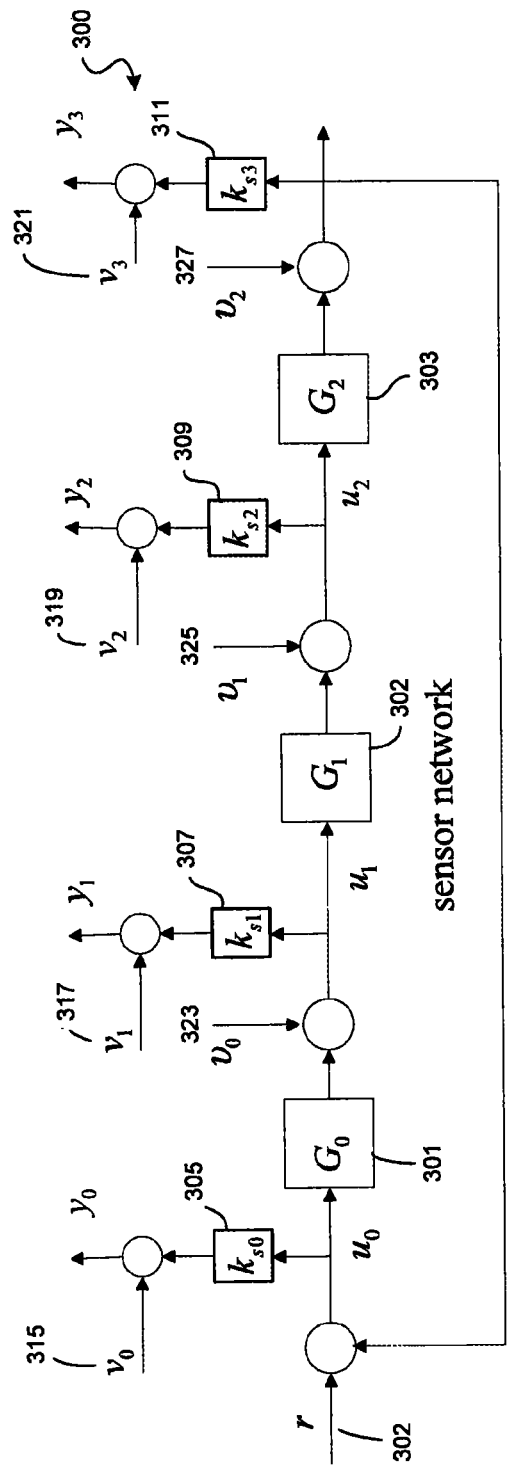
FIG. 3 depicts an exemplary sensor network.

FIG. 3 depicts an exemplary sensor network 300. The network 300 includes sub-systems $G_0$, $G_1$, and $G_2$, represented as 301, 302 and 303 respectively, and sensors $k_{s0}$, $k_{s1}$, $k_{s2}$ and $k_{s3}$, represented as 305, 307, 309 and 311. The sensors are affected by additive measurement noise represented as $\{v_i\}$ and labelled as 315, 317, 319 and 321 respectively. Furthermore, the sub-systems are also subject to noise and disturbances, which are represented as $\{v_i\}$ and labelled 323, 325 and 327 respectively.

In the example sensor network 300, we assume that at least one sensor is not faulty and describe the method of detecting and isolating a faulty sensor or sub-system. Without any loss of generality, the sensor $k_{s0}$ is assumed to be the fault-free one. For the sake of explanation, in the following, two cases of fault scenarios are considered: Case 1: $H_0^{01}=1$; $H_1^{12}=1$; $H_0^{r0}=0$; $H_1^{r1}=1$; $H_1^{r2}=1$; $H_0^{r3}=0$; $H_1^{23}=1$ and Case 2: $H_0^{01}=0$; $H_1^{12}=1$; $H_0^{23}=0$; $H_1^{r0}=1$; $H_1^{r2}=1$; $H_1^{r3}=1$; $H_1^{23}=1$.

Tables 1 and 2 depict the truth tables which include seven rows associated with fault statuses of all consecutive pairs of measurements $\{y_{i-1},y_i\}$:i=1, 2, 3 and all the reference input-to-measurements pairs $\{r,y_i\}$:i=0, 1, 2, 3, as denoted in the first column. The columns indicate both the subsystems and sensors used, i.e., $G_0$, $G_1$, $G_2$, $k_{s0}$, $k_{s1}k_{s2}$; $k_{s3}$, and the rows indicate the 2 sets of pairs, i.e. pairs of consecutive measurements and reference-measurement pairs. These 2 sets of pairs appear as part of the Bayes decisions $H_0^{rj}(H_1^{rj})$, $H_0^{(i-1)i}$ ($H_1^{(i-1)i}$) that are associated with residuals $\{e_{(i-1)j}\}$ and $\{e_{rj}\}$. These Bayes decisions reflect the fault statuses of all of the 7 components (3 subsystems and 4 sensors) based on the Bayes binary decision strategy, with each row indicating '1' for a fault, a '0' for no fault and 'x' for a "don't care condition", i.e. either a '1' or a '0'. Altogether, there are therefore 7 components and 7 pairs of nodes to be considered for fault isolation.

The intersection of each column with the elements of the seven rows indicate the fault status of the component in that particular column. By performing a logical-AND operation on the seven binary results in each column, a new binary value is obtained and stored in a decision vector $d_f$ that is represented in the last row in Tables 1 and 2. Note that Tables 1 and 2 are built on the assumption that subsystem and sensor faults cannot occur simultaneously.

TABLE 1

|  | $G_0$ | $G_1$ | $G_2$ | $k_{s0}$ | $k_{s1}$ | $k_{s2}$ | $k_{s3}$ |
|---|---|---|---|---|---|---|---|
| (0, 1) | 1 | x | x | 1 | 1 | x | x |
| (1, 2) | x | 1 | x | x | 1 | 1 | x |
| (2, 3) | x | x | 1 | x | x | 1 | 1 |
| (r, 0) | 0 | 0 | 0 | 0 | x | x | x |
| (r, 1) | 1 | 1 | 1 | x | 1 | x | x |
| (r, 2) | 1 | 1 | 1 | x | x | 1 | x |
| (r, 3) | 0 | 0 | 0 | x | x | x | 0 |
| $d_f$ | 0 | 0 | 0 | 0 | 1 | 1 | 0 |

TABLE 2

|  | $G_0$ | $G_1$ | $G_2$ | $k_{s0}$ | $k_{s1}$ | $k_{s2}$ | $k_{s3}$ |
|---|---|---|---|---|---|---|---|
| (0, 1) | 0 | x | x | 0 | 0 | x | x |
| (1, 2) | x | 1 | x | x | 1 | 1 | x |
| (2, 3) | x | x | 1 | x | x | 1 | 1 |
| (r, 0) | 1 | 1 | 1 | 0 | 0 | 0 | 0 |
| (r, 1) | 1 | 1 | 1 | x | 1 | x | x |
| (r, 2) | 1 | 1 | 1 | x | x | 1 | x |
| (r, 3) | 1 | 1 | 1 | x | x | x | 1 |
| $d_f$ | 0 | 1 | 1 | 0 | 0 | 0 | 0 |

Tables 1 and 2: Detection Truth Tables for Case 1 and Case 2

A KF is driven by the pair of measurements associated with the start and end of each analyzed path. For instance, for path (r,3) in Table 1, the KF is driven by inputs r and $y_3$. The components within this path are $G_0$, $G_1$, $G_2$ and $k_{s3}$. If the KF residual test statistic is less than the threshold, thus indicating no fault, then a '0' is assigned to all the components within this path, and an "x" is assigned to those outside the path. Similarly for path (r,3) in Table 2, the KF is driven by inputs r and $y_3$. In this case, the test statistic exceeds the threshold, thus indicating a fault. Here, we can only say that either $G_0$ or $G_1$ or $G_2$ or $k_{s3}$ is faulty. Hence a '1' is assigned to $G_0$, $G_1$, $G_2$ and $k_{s3}$, indicating an OR operation, whilst components not in the path, i.e. $k_{s1}$ and $k_{s2}$ are assigned an 'x'.

Note that due to feedback, every path (r,1) (r,2) and (r,3) will be affected if any of the subsystems $G_0$, $G_1$ or $G_2$ is faulty and if so, a "1" will be assigned to all of these components. As for path (2,3), if the status of any of its components $k_{s1}$, $G_2$ and $k_{s3}$ is found faulty, then a '1' will be assigned to all of them in an OR operation. Finally, by logically-ANDing the columns, one can exactly pinpoint the faulty components in those paths (rows) that intersect with the columns for which the decision value $d_f$ is 1.

Furthermore, as stated previously, in the cascade connection of the subsystems in the closed-loop configuration, a single fault occurring in any particular subsystem $G_i$ will indicate a fault in all the components located along the paths (r,$y_0$), (r,$y_1$), (r,$y_2$) and (r,$y_3$), due to the feedback connection. In both cases 1 and 2, faults are isolated from the analysis of at least two different paths. Specifically, in case 1, the isolation of the fault was reached from the analysis of the paths connecting the pairs of measurement nodes (0,1), (1,2) and (2,3); and the paths connecting the reference input and the measurement nodes (r,1),(r,2), whereas in case 2, the isolation of the faults was confirmed from analyzing the pairs (1,2), (2,3); (r,0), (r,1), (r,2), (r,3), respectively, as shown by the shaded rows and columns in Tables 1 and 2.

Figure 4:
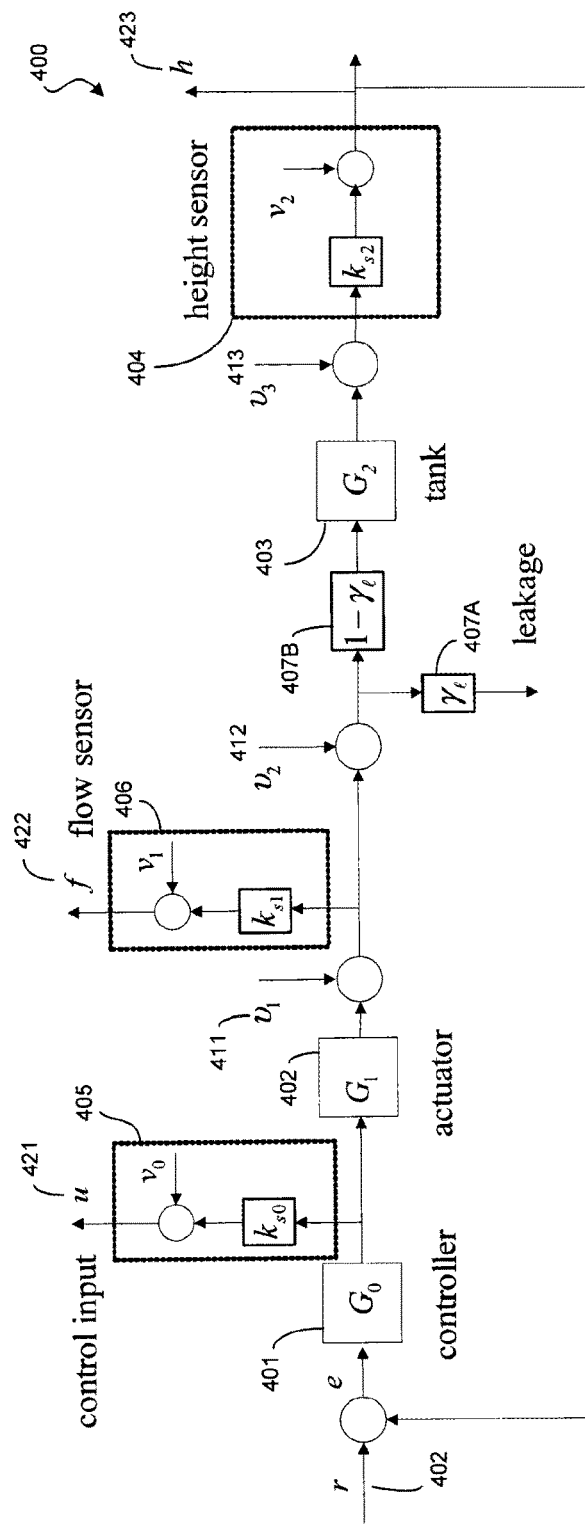
FIG. 4 depicts an exemplary two-tank fluid control system.

FIG. 4 depicts an exemplary physical system illustrating a fluid tank control system 400. The system includes a controller sub-system $G_0$, 401, an actuator tank $G_1$, 402, and the tank $G_2$, 403. The system includes a reference input r, 402, a control input u, 421, a flow sensor 422, a height sensor 404 and a leakage represented by a drain valve 407A. A DC motor-driven pump supplies the fluid to the first tank and a PI controller is used to control the fluid level in the second tank by maintaining the water height at a specified level. The measurements include the error $y_0$ (represented as e), the control input $y_1(k)$ (represented as u), the flow rate $y_2(k)$ (represented as f), and the height of the liquid $y_3(k)$ (represented as h).

The sensor network is subject to possible faults in the controller $G_0$, in the control input sensor $k_{s0}$, in the actuator $G_1$, the flow sensor $k_{s1}$, the height sensor $k_{s2}$ and the tank $G_2$ due to leakage. The leakage $\gamma_l$ is caused by the opening of the drain valve. Note that the portion of fluid entering the second tank $G_2$, after incurring a leakage is represented as $1-y_l$ (407B).

The following Kalman Filters are employed to detect a fault in the system: (1) $KF_{ru}$ detects a fault in the controller $G_0$, or in the actuator $G_1$, or in the tank $G_2$, or in the controller sensor $k_{s0}$, or in the height sensor $k_{s2}$; (2) $KF_{rf}$ detects a fault in the controller $G_0$, or in the actuator $G_1$, or in the tank $G_2$, or in the height sensor $k_{s2}$ or in the flow sensor $k_{s1}$; (3) $KF_{rh}$ detects a fault in the controller $G_0$, or in the actuator $G_1$, or in the tank $G_2$ or in the height sensor $k_{s2}$; (4) $KF_{eu}$ detects a fault in the controller $G_0$ or in the sensor $k_{s0}$; (5) $KF_{fu}$ detects a fault in the actuator $G_2$, or in the flow sensor $k_{s1}$, or in the controller sensor $k_{s0}$; and (6) $KF_{fh}$ detects a fault in a the tank $G_2$, flow sensor $k_{s1}$ or height sensor $k_{s2}$.

In what follows, a model of the two-tank system 400 is first derived followed by a detailed description of the fault determination.

The flow $Q_i$ is expressed by the following first-order nonlinear equation:

$$\dot{Q}_i = -a_m Q_i + b_m \phi(u) \quad (45)$$

where u is the control input to the motor, $a_m$ and $b_m$ the parameters of the motor-pump subsystem and $\phi(u)$ a dead-band and saturation-type of nonlinearity. The Proportional and Integral (PI) controller is given by:

$$\dot{x}_3 = e = r - h_2$$

$$u = k_p e + k_i x_3 \quad (46)$$

where $k_p$ and $k_i$ are the PI controller's gains and r is the reference input. With the inclusion of the leakage, the liquid level system can be modeled as:

$$A_1 \frac{dH_1}{dt} = Q_i - C_{12}\varphi(H_1 - H_2) - C_l \varphi(H_1)$$

$$A_2 \frac{dH_2}{dt} = C_{12}\varphi(H_1 - H_2) - C_o\varphi(H_2) \quad (47)$$

where $\varphi(.) = \text{sign}(.)\sqrt{2g(.)}$, $C_l\varphi(H_1) := Q_l$ is the leakage flow rate, $C_o\varphi(H_2) := Q_o$ is the output flow rate, $H_1$ is the height of the liquid in tank 1, $H_2$ the height of the liquid in tank 2, $A_1$ and $A_2$ the cross-sectional areas of the 2 tanks, $g=980$ cm/sec² the gravitational constant, $C_{12}$ and $C_o$ the discharge coefficients of the inter-tank and output valves, respectively. The linearized state-space model of the entire system is given by:

$$\dot{x} = Ax + Br$$

$$y = Cx \quad (48)$$

where x, A, B and C are given by:

$$x = \begin{bmatrix} h_1 \\ h_2 \\ x_3 \\ q_i \end{bmatrix}, A = \begin{bmatrix} -a_1 - \alpha & a_1 & 0 & b_1 \\ a_2 & -a_2 - \beta & 0 & 0 \\ -1 & 0 & 0 & 0 \\ -b_m k_p & 0 & b_m k_I & -a_m \end{bmatrix},$$

$$B = \begin{bmatrix} 0 & 0 & 1 & b_m k_p \end{bmatrix}^T, C = \begin{bmatrix} 1 & 0 & 0 & 0 \end{bmatrix}$$

where $q_i$, $q_l$, $q_o$, $h_1$ and $h_2$ are respectively the increments in $Q_i$, $Q_l$, $Q_o$, $H_1^0$ and $H_2^0$, whereas $a_1$, $a_2$, $\alpha$ and $\beta$ are parameters associated with the linearization process, $\alpha$ is the leakage flow rate, $q_l = \alpha h_1$, and $\beta$ is the output flow rate, and $q_o = \beta h_2$.

According to an embodiment, four simple faults are considered herein and defined as follows: (1) an actuator fault in subsystem $G_1$, (2) a flow sensor fault in $k_{s1}$, (3) a height sensor fault in $k_{s2}$ and (4) a leakage fault in subsystem $G_2$ (due to variations in $y_l$). The Kalman filter bank used here consists of 6 Kalman filters with pairs of inputs (r,u),(r,f), (r,h),(e,u)(u,f) and (f,h), and denoted respectively by $KF_{ru}$, $KF_{rf}$, $KF_{rh}$, $KF_{uf}$ $KF_{eu}$ and $KF_{uh}$. As pointed out earlier, it is assumed that only a simple fault can occur at any given time instant. Each of the six Kalman filters used is designed using the identified nominal model relating its own pair of inputs. The residuals of these Kalman filters are then used to detect and isolate the various possible faults, as described next.

Figure 5:
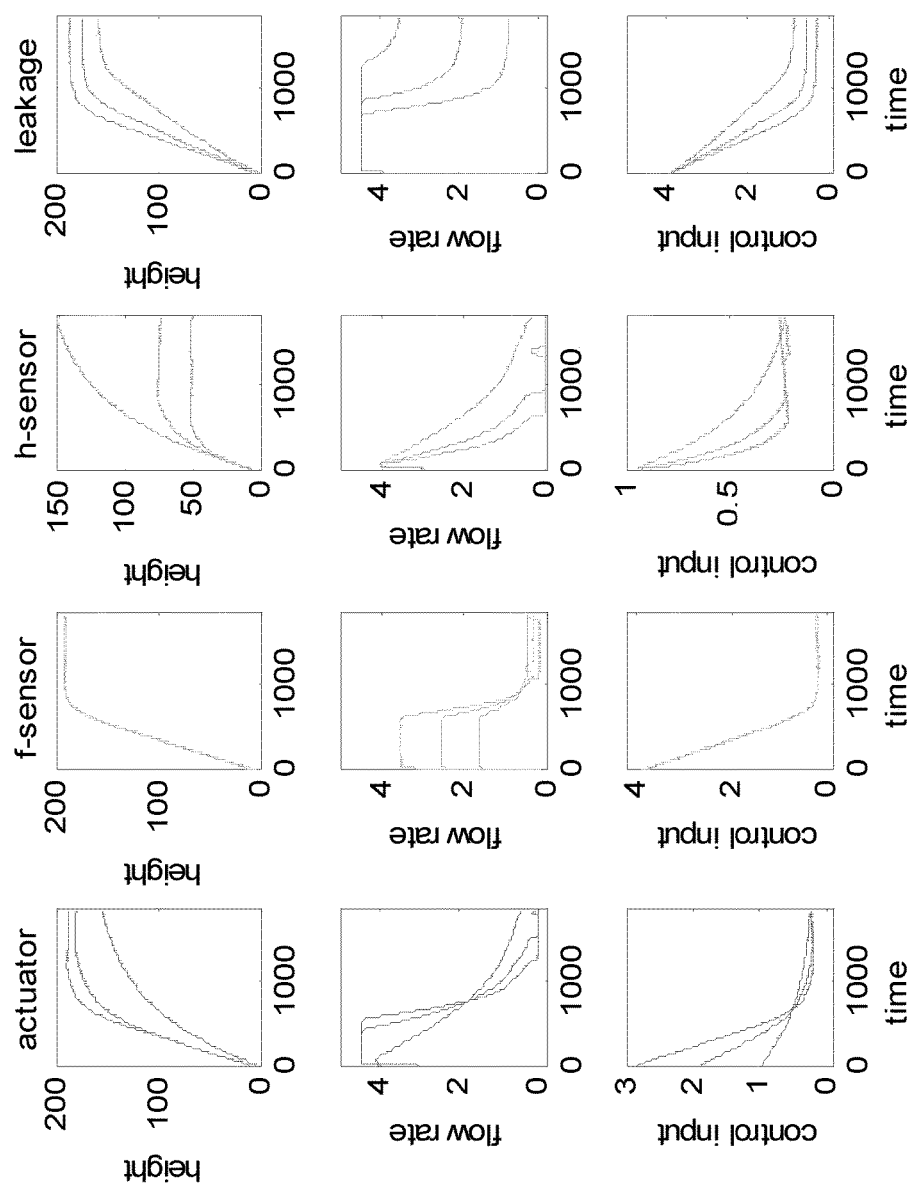
FIG. 5 illustrates performance of the two-tank control system parameters.

According to one embodiment, a number of experiments were performed using National Instruments LAB VIEW software to acquire the required data pertaining to the height of the water level in the tank, the flow rate, and the control input to the actuator under normal (no fault) and "faulty" scenarios. Data on the faults were obtained by emulating (a) actuator faults, (b) flow sensor faults, (c) height sensor faults and (d) leakage faults. FIG. 5 depicts the plots of the height, flow rate and control input with columns 1, 2, 3 and 4 corresponding respectively to actuator faults, flow rate sensor faults, height sensor faults and leakage faults. Three experiments for each of the fault scenarios were performed to cover different fault sizes, namely a small, a medium and a large fault size. From the flow rate profiles, it can be deduced that the system is highly nonlinear, especially because of the saturation-type of nonlinearity it contains. Further, the reference input considered was constant and is the same for all fault scenarios, and its value is chosen such that under fault-free (normal) operating scenario the saturation effect is absent. The height of the water level reaches the reference input value asymptotically due to the presence of PI controller. If however, there is fault, and as a consequence the flow rate hits the saturation limit, the height will be prevented from reaching asymptotically the reference input. Thus, as shown in FIG. 5, the height will reach a level less than the reference input.

For the data shown in FIG. 5, a constant reference input is considered and the test statistics have been computed based on equation (42), for the three experiments under actuator, flow sensor, height sensor and leakage faults. The scaled-up (by a factor of 1000) versions of these test statistics are given in Table 3 below, where, for each fault scenario, the rows indicate the six paths analyzed, i.e. (e,u)(u,f), (f,h), (r,h), (r,u), (r,f), and(r,h), and the columns indicate the three experiments carried out, i.e.: ex.1, ex.2, ex. 3.

TABLE 3

Scaled-up test statistics of residuals for 3 experiments with 4 faults

|  | actuator fault | | | flow sensor fault | | | height sensor fault | | | leakage fault | | |
|---|---|---|---|---|---|---|---|---|---|---|---|---|
|  | ex. 1 | ex. 2 | ex. 3 | ex. 1 | ex. 2 | ex. 3 | ex. 1 | ex. 2 | ex. 3 | ex. 1 | ex. 2 | ex. 3 |
| (e, u) | 0.01 | 0.01 | 0.01 | 0.01 | 0.01 | 0.01 | 0.01 | 0.01 | 0.01 | 0.01 | 0.01 | 0.01 |
| (u, f) | 0.96 | 1.84 | 2.66 | 3.10 | 3.18 | 3.33 | 0.93 | 0.85 | 0.82 | 3.48 | 3.41 | 3.15 |
| (f, h) | 0.04 | 0.21 | 0.29 | 1.76 | 1.27 | 0.83 | 0.51 | 1.32 | 1.63 | 0.23 | 1.24 | 2.33 |
| (r, h) | 0.59 | 56.28 | 70.87 | 77.68 | 75.71 | 78.61 | 6.94 | 100.7 | 140.2 | 71.04 | 45.0 | 3.27 |
| (r, f) | 0.04 | 0.12 | 0.11 | 1.52 | 1.06 | 0.47 | 0.15 | 1.11 | 1.37 | 0.73 | 2.10 | 3.65 |
| (r, u) | 1.91 | 3.61 | 5.26 | 6.83 | 6.77 | 6.84 | 1.88 | 2.04 | 2.0 | 6.69 | 6.18 | 5.3 |

For the sake of convenience, Table 4 depicts the truth tables for the faults based on the test statistics of only experiment 3 (ex. 3). Bayes binary decisions for the paths (r,u), (r,f), (r,h), (e,u), (u,f) and (f,h) are shown by a '1', '0' and 'x' to indicate if there is a 'fault', 'no fault' and 'not applicable (don't care status labelled by 'x')', respectively.

TABLE 4

Bayes binary decisions

|  | flow sensor fault | | | | | | height sensor fault | | | | | | leakage faults | | | | | |
|---|---|---|---|---|---|---|---|---|---|---|---|---|---|---|---|---|---|---|
|  | $G_0$ | $k_{s0}$ | $G_1$ | $G_2$ | $ks_1$ | $ks_2$ | $G_0$ | $k_{s0}$ | $G_1$ | $G_2$ | $ks_1$ | $ks_2$ | $G_0$ | $k_{s0}$ | $G_1$ | $G_2$ | $ks_1$ | $ks_2$ |
| (r, u) | 0 | 0 | 0 | 0 | x | 0 | 1 | 1 | 1 | 1 | x | 1 | 1 | 1 | 1 | 1 | x | 1 |
| (r, f) | 1 | x | 1 | 1 | 1 | 1 | 1 | x | 1 | 1 | 1 | 1 | 1 | x | 1 | 1 | 1 | 1 |
| (r, h) | 0 | x | 0 | 0 | x | 0 | 1 | x | 1 | 1 | x | 1 | 1 | x | 1 | 1 | x | 1 |
| (e, u) | 0 | 0 | x | x | x | x | 0 | 0 | x | x | x | x | 0 | 0 | x | x | x | x |
| (u, f) | x | 1 | 1 | x | 1 | x | x | 0 | 0 | x | 0 | x | x | 0 | 0 | x | 0 | x |
| (f, h) | x | x | x | 1 | 1 | 1 | x | x | x | 1 | 1 | 1 | x | x | x | 1 | 1 | 1 |
| $d_f$ | 0 | 0 | 0 | 0 | 1 | 0 | 0 | 0 | 0 | 1 | 0 | 1 | 0 | 0 | 0 | 1 | 0 | 1 |

From the last row indicating the binary decision vector $d_f$, it can be seen that a fault in either the actuator or in the flow sensor are accurately isolated. However, in the "leakage or height sensor fault" scenario, Table 4 asserts that both the tank ($G_2$) and the height sensor ($k_{s2}$) are faulty, instead of pinpointing only to the tank as being the sole faulty component. The reason for this is that both of the leakage fault parameter ($y_f$), which affects the tank, and the height sensor appear together in cascade in all of the paths. Further due to saturation type nonlinearity, when there is a leakage fault the PI controller is unable to maintain the reference height. In the case when the saturation limit is not reached under a fault condition, that is when the fault size is small (an incipient fault), there is no problem in isolating the leakage from height sensor fault. Furthermore, In the cascade connection of the subsystems in the closed-loop configuration, a single fault occurring in any particular subsystem $G_1$, or $G_2$, or sensor $k_{s2}$ will indicate a fault in all of the components located along the paths (r,u), (r,f), and (r,h).

According to one embodiment, fault diagnosis of a class of nonlinear system using an adaptive Kalman filter is described. The system includes scheduling parameters, and emulator parameters. The scheduling parameters are chosen such that they are capable of tracking variations in the system model as a result of changes in the operating regime of the system. The emulator parameters, on the other hand, simulate variations in the subsystems during the identification phase and have negligible effect during the operational phase. The nominal model and the influence vectors (described below), which are the gradient of the feature vector respect to the emulator parameters, are identified off-line from a number of emulator parameter perturbed experiments. A Kalman filter is designed using the identified nominal model. As the system varies, the Kalman filter model is adapted using the scheduling variables. The residual is employed for fault diagnosis purposes.

A fault is detected and isolated for the following practical cases, Case 1: the measurements include all the inputs and/or the outputs of all the subsystems whose faults have to be detected and isolated. For example, if fault in a sensor, a controller, an actuator and a plant is to be detected and isolated, then measurements include the sensor output, the controller input and the output, the actuator inputs as well as the input and the output of the plant, and Case 2: where the measurements are restricted to inputs and/or outputs of only some of the subsystems whose faults have to be detected and isolated (that is the inputs and/or the outputs of some subsystems may not be accessible). For example a fault in a sensor, a controller, an actuator or a plant is to be detected and isolated even if the measurement is restricted only to the input and the output of the system.

According to an embodiment, the class of nonlinear systems considered herein may be approximated by a piecewise linear model for the intended applications, including the detection and isolation of incipient faults. The scheduling variables are configured to track the behavior of the nonlinear system over all operating regimes.

The scheduling variable $\xi$ is a function of the state of the system $x(k)$. A finite number of l-indexed scheduling variables, $\{\xi^l\}$, are selected to cover all the relevant operating regimes.

The scheduling vector is a p×1 discrete-time vector given by:

$$\xi^l = [\xi_1^l \xi_2^l \xi_3^l . \xi_p^l]^T, l=0,1,2,\ldots \quad (49)$$

The index l indicates an operating point, and $\xi^0$ is the scheduling variable indicating the nominal fault-free operating regime. The nonlinear model of the system is linearized at each discrete variable $\xi^l$ to obtain a set of piecewise-linear approximate models $\{G(\xi^l,z):l=0, 1, 2, \ldots\}$. The transfer function, $$G(\xi^l, z) = \frac{N(\xi^l, z)}{D(\xi^l, z)}$$

of the overall system relating the input r(k) and the output y(k) may be expressed using a linear regression model as:

$$y(k) = \psi^T(k)\theta(\xi^l) + v(k) \quad (50)$$

wherein, $\psi^T(k) = [-y(k-1) - y(k-2) \ldots -y(k-n_a) r(k-1) r(k-2) \ldots r(k-n_b)]$ (51)

ψ(k) is an M×1 data vector, $M=n_a+n_b$, $n_a$ and $n_b$ are respectively the orders of the numerator $N(\xi^l,z)$ and denominator $D(\xi^l,z)$, $\theta(\xi^l)$ is an M×1 feature vector, which is a function of the scheduling variable $\xi^l$:

$$\theta(\xi^l) = [a_1(\xi^l) a_2(\xi^l) \ldots a_{n_a}(\xi^l) b_1(\xi^l) b_2(\xi^l) \ldots b_{n_b}(\xi^l)]^T \quad (52)$$

where $\{a_i(\xi^l)\}$ and $b_i(\xi^l)$ are respectively the coefficients of $D(\xi^l,z)$ and $N(\xi^l,z)$.

Emulators are a powerful tool to use whenever access to the variables of interest is either not possible or difficult/costly to achieve. Accordingly, the role of emulators in the identification and fault diagnosis phases is described below by analysing the following 3 cases: case (a) the case when the map relating the feature vector of the overall system, $\theta(\xi^l)$, to the individual feature vectors, $\theta^i(\xi^l)$, of the subsystems $G_i(\xi^l,z)$, i=0, 1, 2, . . . , q−1, is known a priori. Examples include systems where the structure of its model may be derived from the physical laws and further the structure of the identified and the actual models are the same. Let this map be represented by the function $\phi(., ., \ldots, .)$ given below:

$$\theta(\xi^l) = \phi(\theta^0(\xi^l), \theta^1(\xi^l), \ldots, \theta^{q-1}(\xi^l)) \quad (53)$$

In this case, the fault isolation problem is considerably simplified since the required procedure would simply consists of first identifying $\theta(\xi^l)$, and then estimating from it, $\theta^i(\xi^l)$ using the known functional relationship $\theta(\xi^l) = \phi(\theta^0(\xi^l), \theta^1(\xi^l), \ldots, \theta^{q-1}(\xi^l))$. A subsystem $G_i(\xi^l,z)$ is asserted to be faulty if the estimate of its feature vector $\theta^i(\xi^l)$ deviates from its nominal fault-free value.

In case (b), when the parameters of the subsystems are accessible, then it is possible to estimate the mapping function $\phi(., ., \ldots, .)$ by performing a number of parameter-perturbed experiments using emulators as explained next. Example includes controllers whose parameters are accessible and which may be manipulated.

In case (c), the map relating the feature vector and the parameters of the subsystems is not known and the parameters within a subsystem are not accessible.

In practice, this case is the most common and hence mot general of the 3 cases. To overcome this practical problem, emulators are included at the input, output, or both to indirectly induce variations in the associated subsystems during the identification phase. The emulator is a hardware or software device which takes the form of a transfer function with its own accessible parameters that are called emulator parameters. An emulator is connected in cascade with a subsystem (whose faults have to be detected and isolated) during the identification stage, and it has a negligible effect on the system's dynamical behavior during the operational stage. In many practical problems, the emulator is chosen to mimic the macroscopic behavior of the system characterized by gain and phase changes in the system transfer function. The emulator is chosen either as a constant gain ($\gamma_i$), a pure delay of d time instants ($\gamma^i, z^{-d}$), an all-pass first-order filter $$\frac{\gamma_i + z^{-1}}{1 + \gamma_i z^{-1}},$$

a Blaschke product of all-pass first-order filters $$\prod_j \frac{\gamma_j + z^{-1}}{1 + \gamma_j z^{-1}},$$

where $\gamma_j$ induces phase variations, or any other combination of these. Note here that the inclusion of time delay in the emulators allows us to model a larger class of practical fault-generation mechanisms, ranging from those with no delay at all (instantaneous ones) to those with non-negligible delays.

During the operational phase, emulators, termed as nominal emulators, are selected such that they have a negligible effect on the behavior of the overall system. The static emulators are disconnected, i.e. they are set equal to unity. The dynamic emulators, on the other hand, are not disconnected. They are chosen to be stable with their transfer functions approximately equal to one, so that the order of the system during the identification and the operational phase are identical. The rationale behind this is that it is difficult to develop a fault diagnosis scheme for a system where there is a jump in the model order during a transition from one phase to the other.

Figure 6:
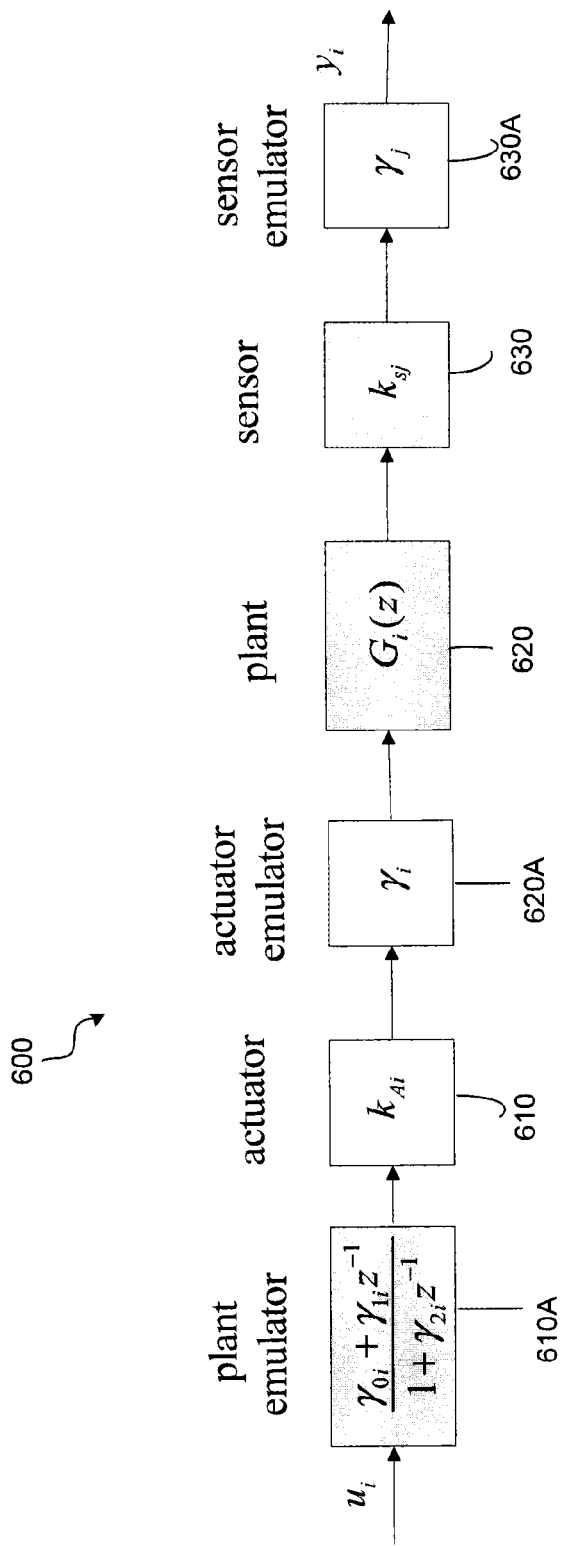
FIG. 6 depicts an exemplary system including emulators connected in a cascade configuration.

FIG. 6 depicts a system 600 including an actuator $k_{Ai}$, 610, a plant $G_i$, 620, a sensor $k_{si}$, 630, and the associated emulators (610A, 620A, and 63A) during the identification phase According to an embodiment, the emulators used to mimic variations in the plant, the actuator and the sensor are given respectively by an all-pass filter $$\frac{\gamma_{0i} + \gamma_{1i} z^{-1}}{1 + \gamma_{2i} z^{-1}},$$

a static gain $\gamma_i$, and a different static gain $\gamma_j$. Note, that the emulator and the scheduling parameters play an important role in the identification of a system with applications including fault diagnosis, health monitoring and condition-based maintenance. An emulator mimics variations in the associated subsystems during identification whereas the scheduling parameters track the variations in the operating regime of the system.

For the sake of simplicity, the emulator is considered in FIG. 6 is assumed to be one of a first-order all-pass filter and a static-gain filter. However, the description provided herein is equally applicable to a more general case of dynamic emulators. Let $\gamma_i$ be the emulator parameter, which may be a static gain or phase parameter of the all-pass filter. The emulator parameter vector $\gamma$ for the entire interconnected system is a (q×1) vector $\gamma_i$, i=1, 2, ..., q for 'subsystems, $G_i(z)$, i=1, 2, ..., q, that are subject to failure. The overall q×1 diagnostic parameter vector $\gamma$ formed of all the subsystem emulator parameters $\{\gamma_i\}$ is:

$$\gamma = [\gamma_1 \gamma_2 . \gamma_q]^T \quad (54)$$

Let $\gamma^0$ be nominal fault-free parameter value and its variation $\Delta\gamma$ as given below:

$$\Delta\gamma = \gamma - \gamma^0 \quad (55)$$

Also let $\theta_0(\xi^l)$ be the nominal fault-free feature vector corresponding to the nominal emulator parameter values $\gamma^0$. The deviation in the feature vector is a nonlinear function of the deviations in the emulator parameters:

$$\Delta\theta(\xi^l, \Delta\gamma) = \theta(\xi^l) - \theta^0(\xi^l) = \varphi(\xi^l, \Delta\gamma) \quad (56)$$

where $\theta^0(\xi^l)$ is the nominal fault-free feature vector corresponding to the emulator parameter values $\gamma^0$. The nonlinear function $\varphi(\xi^l, \Delta\gamma)$ can be expressed as a power series in $\{\Delta\gamma_i\}$ with a finite number of terms as given below:

$$\Delta\theta(\xi^l, \Delta\gamma) = \quad (57)$$
$$\sum_i \Omega_i(\xi^l) \Delta\gamma_i + \sum_{i,j} \Omega_{ij}(\xi^l) \Delta\gamma_i \Delta\gamma_j + \sum_{i,j,k} \Omega_{ijk}(\xi^l) \Delta\gamma_i \Delta\gamma_j \Delta\gamma_k +$$
$$\ldots + \sum_{1,2,3,\ldots,q} \Omega_{123\ldots q}(\xi^l) \Delta\gamma_1 \Delta\gamma_2 \Delta\gamma_3 \ldots \Delta\gamma_q$$

where $\Omega_i(\xi^l)$, $\Omega_{ij}(\xi^l)$, $\Omega_{ijk}(\xi^l)$, ..., $\Omega_{123\ldots q}(\xi^l)$ are M×1 vectors which denote the first, second, third and up to $q^{th}$ partial derivatives of $\theta$ with respect to $\gamma$, and which termed influence vectors given by:

$$\Omega_i(\xi^l) = \frac{\partial \theta}{\partial \gamma_i}, \Omega_{ij}(\xi^l) = \frac{\partial^2 \theta}{\partial \gamma_i \partial \gamma_j}, \Omega_{ijk}(\xi^l) = \frac{\partial^3 \theta}{\partial \gamma_i \partial \gamma_j \partial \gamma_k}, \quad (58)$$
$$\Omega_{123\ldots q}(\xi^l) = \frac{\partial^q \theta}{\partial \gamma_1 \partial \gamma_2 \partial \gamma_3 \ldots \partial \gamma_q}$$

The nominal feature vector and all the partial derivatives are computed at the scheduling variable $\xi^l$. The influence vectors are the measures of sensitivity of the feature vector to the variations in the emulator parameters. Let $\Omega(\xi^l)$ be a matrix formed of all the influence vectors, which is termed here as the influence matrix, and defined as:

$$\Omega(\xi^l) = [\Omega_1(\xi^l) \ldots \Omega_i(\xi^l) \ldots \Omega_{12}(\xi^l) \ldots \Omega_{ij}(\xi^l) \ldots$$
$$\Omega_{123}(\xi^l) \ldots \Omega_{ijk}(\xi^l) \ldots \Omega_{123\ldots q}(\xi^l)] \quad (59)$$

Substituting for the finite power series expression (57) for the feature vector in the linear regression model (50) yields:

$$y(k) = \psi^T(k)\left(\theta^0(\xi^l) + \sum_i \Omega_i(\xi^l) \Delta\gamma_i + \quad (60)\right.$$
$$\sum_{i,j} \Omega_{ij}(\xi^l) \Delta\gamma_i \Delta\gamma_j + \sum_{i,j,k} \Omega_{ijk}(\xi^l) \Delta\gamma_i \Delta\gamma_j \Delta\gamma_k + \ldots +$$
$$\left.\sum_{1,2,3,\ldots,q} \Omega_{123\ldots q}(\xi^l) \Delta\gamma_1 \Delta\gamma_2 \Delta\gamma_3 \ldots \Delta\gamma_q\right) + v(k)$$

Note that the linear regression model of equation (7) is also termed as the diagnostic model. This model is more general, more informationally rich and thus more accurate, than the traditional one as it includes products of the deviations in the emulator parameters. Hence, compared to the traditional models, which are functions only of the scheduling parameters, the diagnostic model of (7) can encompass applications requiring fault diagnosis of systems where multiple component faults may occur simultaneously.

The accuracy and reliability of the identified model are critical for superior fault diagnosis performance. Accordingly, by an embodiment of the present disclosure, a method of identifying the nominal model is characterized by the feature vector $\hat{\theta}^0(\xi^l)$ and is estimated by performing a number of experiments by varying one or more emulator parameters $\{\gamma_i\}$ to cover likely operating regions in the neighborhood of, and including, a given operating point as shown in FIG. 7.

Figure 7:
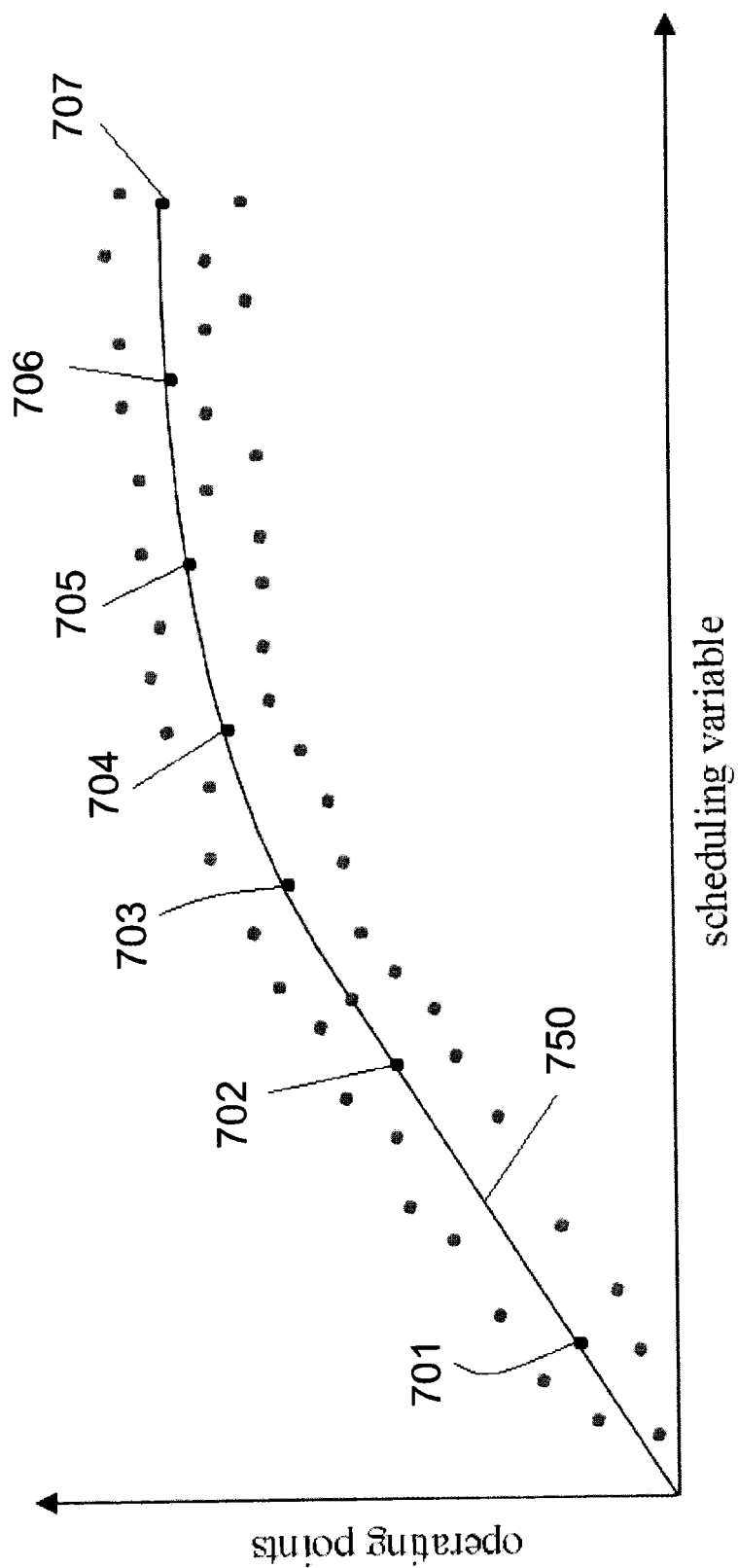
FIG. 7 illustrates a graph depicting emulator operational points.
Figure 8:
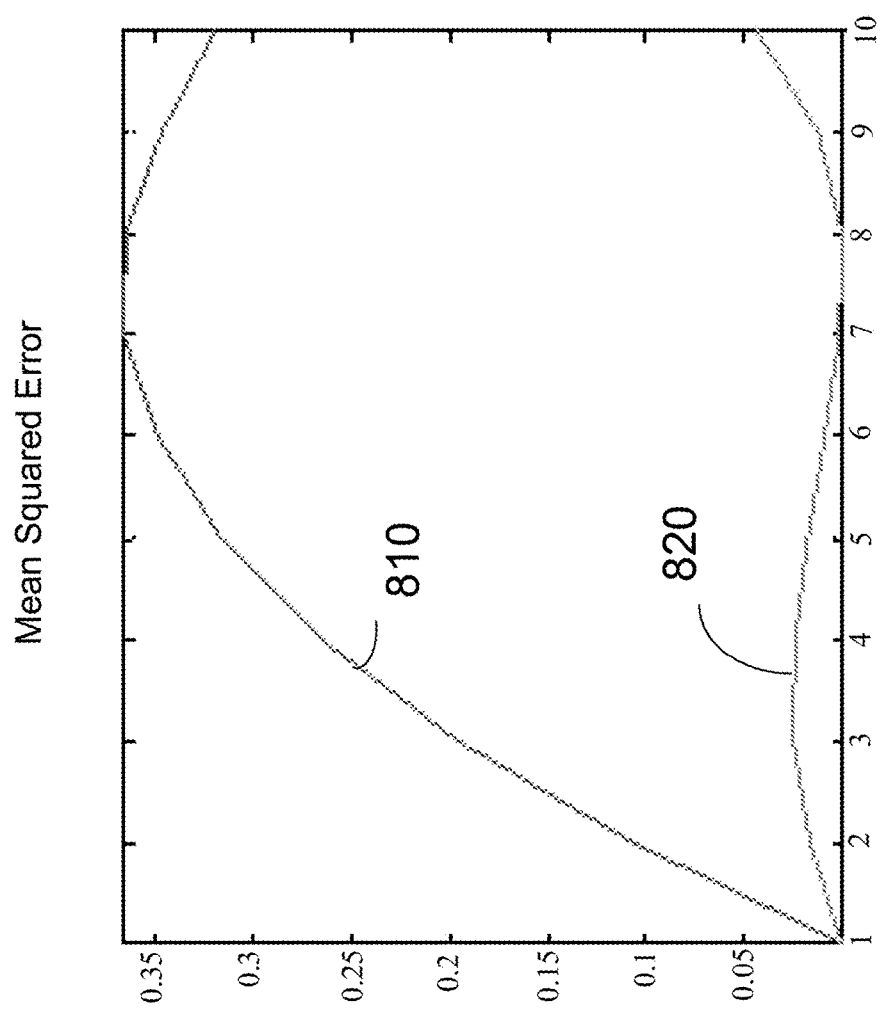
FIG. 8 illustrates a graph depicting mean squared errors.

FIG. 7 shows the nominal operating points 701-707 that lie on curve 750, and those generated by varying the emulator parameters (points lying around the curve 750) $\{\gamma_i\}$ as a function of the scheduling variable $\{\xi^l\}$. An 'optimal nominal model' is obtained as the best fit to the measurement data collected from all the experiments. According to an embodiment, the nominal model is obtained as the best fit to the measurement data collected at the nominal operating points. The identified nominal model thus obtained characterizes the behavior of the system over wider operating regions (in the neighborhood of the nominal operating point), whereas typical schemes employed in determining the model characterize the model by using merely the nominal operating point. Thus, the identification scheme of the present disclosure is robust to model perturbations. Therefore as shown in FIG. 8, the mean-squared error of the method described above (and represented by curve 820) is considerably lower than the mean squared error (represented by curve 810) of typical schemes employed in nominal model identification.

In practical systems, the input-output data of subsystems whose faults have to be detected and isolated may be accessible or restricted to those of some subsystems. Accordingly, if the input-output data of all sub-systems is available, the bank of Kalman filter approach for each pair of measurements as previously described may be used. However, if only some subset of data is available, an influence vector approach may be utilized. In the influence vector approach, the measurements are restricted to inputs and/or outputs of only some of the subsystems (that is the inputs, outputs or both of some subsystems may not be accessible). For example, a fault in a sensor, a controller, an actuator or a plant is to be detected and isolated even if the measurement is restricted only to the input and the output of the system. In this case, influence vectors associated with each fault type (or the direction of each fault type) is computed during the identification phase and a fault type is determined from the maximum correlation between the KF residual and the hypothesized residual estimates.

In general, the bank of Kalman filter approach is computationally efficient, simple, and provides a closed form solution to both simple and multiple faults. On the other hand, the influence vector approach is computationally efficient, and simple, and provides a closed form solution for simple faults. For multiple faults, however, there are no closed form solutions and the optimal solutions can be computed iteratively.

According to an embodiment, in the influence vector approach, a finite number of scheduling variables, $\xi^l$, are selected to cover the relevant operating regimes. The scheduling variable is a p×1 discrete-time vector:

$$\xi^l = [\xi_1^l \xi_2^l \xi_3^l . \xi_p^l], \text{ for } l=0,1,2 \ldots$$

The index e indicates an operating point, and $\xi^o$ is the scheduling variable indicating the nominal fault-free operating regime. The nonlinear model of the system is linearized at each discrete variable $\xi^l$ to obtain a set of piecewise linear approximate models $\{G(\xi^l,z)\}$. A subsystem $G_i(\xi^l,z)$ may be a process (or a plant), a controller, an actuator, or another device, and is associated with an emulators $E_i(z)$. The parameter $\gamma^i$ of $E_i(z)$ is selected so that it is capable of monitoring solely the health of the subsystem $G_i(\xi^l,z)$. The emulator parameter vector $\gamma$ for the entire interconnected system is a (q×1) vector that augments $\{\gamma^i, i=1, 2, \ldots, s\}$ for all subsystems, $G_i(\xi^l,z)$, $i=1, 2, \ldots, s$, that are subject to failure. Let $\gamma=[\gamma^1\gamma^2\gamma^3 \ldots \gamma^s]^T=[\gamma_1\gamma_2 \ldots \gamma_q]^T$ be the overall q×1 diagnostic parameter vector $\gamma$ formed of all the subsystem diagnostic parameters $\{\gamma^i\}$.

The linear regression model of the system during the identification phase takes the following form:

$$y(k) = \psi^T(k)(\theta^o(\xi^l) + \Delta\theta) + v(k) \quad (61)$$

where $$\Delta\theta = \varphi(\Delta\gamma) = \sum_i \Omega_i \Delta\gamma_i + \sum_{i,j} \Omega_{ij}\Delta\gamma_{ij} + \sum_{i,j,k} \Omega_{ijk}\Delta\gamma_{ijk} \ldots + \sum_{1,2,3,\ldots,q} \Omega_{123\ldots q}\Delta\gamma_{123\ldots q} \quad (62)$$

where $\theta^o(\xi^l)$ is the nominal fault-free feature vector corresponding to the emulator parameter values $\gamma^o$; $y^o(k)=\psi^T(k)\theta^o(\xi^l)$ is the nominal output; $\Omega_i(\xi^l)$, $\Omega_{ij}(\xi^l)$, $\Omega_{ijk}(\xi^l)$, … $\Omega_{123\ldots q}(\xi^l)$ are M×1 vectors, termed influence vectors, which denote the first, second, third and up to $q^{th}$ partial derivatives of $\theta$ with respect to $\gamma$ as given by, $$\Omega_i(\xi^l) = \frac{\partial\theta}{\partial\gamma_i}, \Omega_{ij}(\xi^l) = \frac{\partial^2\theta}{\partial\gamma_i\partial\gamma_j}, \ldots,$$

$$\Omega_{123\ldots q}(\xi^l) = \frac{\partial^q\theta}{\partial\gamma_1\partial\gamma_2\partial\gamma_3 \ldots \partial\gamma_q}$$

The nominal feature vector and all the partial derivatives are computed at the scheduling variable $\xi^l$. The nominal feature vector $\theta^o(\xi^l,\gamma^o)$ and influence matrix $\Omega$ formed of influence vectors, $\Omega=[\Omega_i(\xi^l), \Omega_{ij}(\xi^l), \Omega_{ijk}(\xi^l), \ldots \Omega_{123\ldots q}(\xi^l)]$, completely describe how subsystems $\{G(\xi^l,z)\}$ affect the overall interconnected system. The set of influence vector $\Omega$ is estimated by minimizing the log likelihood function $l(\gamma|e)$ during the identification phase using the reliable and accurate identification scheme described earlier with reference to FIG. 7.

Accordingly, the estimate of the influence vector can be represented as:

$$\hat{\Omega} = \arg\left\{\min_\Omega \{l(\gamma|e) = \|e(k) - \Phi(k)\varphi(\Delta\gamma)\|^2\}\right\} \quad (63)$$

where $\Phi(z) = \frac{\psi^T(z)}{F(z)}$.

The fault detection problem can be posed as binary composite hypothesis testing problem, wherein the threshold value is chosen as an acceptable trade-off between the correct detection and false alarm probabilities. The Bayes detection decision strategy is similar to equations (42) and (43) as previously described.

With regards to fault isolation, a Bayesian multiple composite hypotheses testing scheme is employed. It is based on determining which of the diagnostic parameters $\gamma_i$:i=1, 2, 3, ..., q has varied. According to an embodiment, a maximum likelihood (ML) method, which is an efficient and unbiased technique is employed to estimate the variation $\Delta\gamma$. The ML estimate $\Delta\hat{\gamma}$ of $\Delta\gamma$ is obtained by minimizing the log likelihood function $l(\gamma|e)$ given by:

$$\Delta\hat{\gamma} = \arg\left\{\min_{\Delta\gamma}\|e(k) - \Phi(k)\varphi(\Delta\gamma)\|^2\right\} \quad (64)$$

wherein the subsystem $G_i(z)$ is asserted to be faulty if $|\Delta\gamma_i|$ exceeds some threshold value. Furthermore, the fault indicator function $\Phi(k)\varphi(\Delta\gamma)$ is a nonlinear function of $\{\Delta\gamma_i\}$ as shown in (62), and as result, there is no closed-form solution to the minimization problem except for the case of simple faults.

Figure 9:
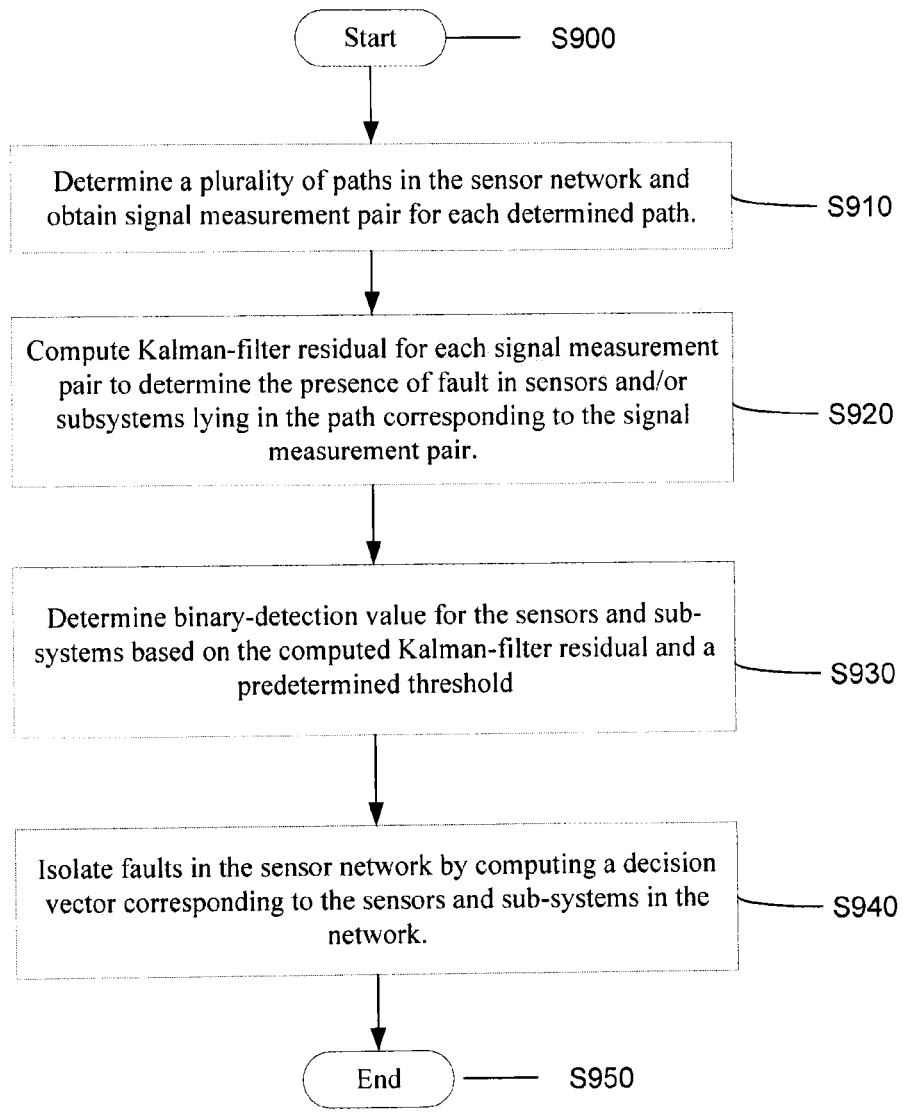
FIG. 9 depicts a graph illustrating a fault detection and isolation method according to one embodiment.

FIG. 9 depicts, according to an embodiment, a graph illustrating the steps performed in order to detect and isolate a fault in the sensor network.

The method starts in step S900 and proceeds to step S910. In step S910, a plurality of paths in the sensor network is identified based on a pair of signal measurements. According to one embodiment, the pair of signal measurements may be a reference signal-sensor measurement pair, or a pair of consecutive sensor measurements. Note that for a sensor network system including a single reference signal input and Q sensors, there are Q pairs of reference signal-sensor measurements and (Q-1) pairs of consecutive sensor measurement. As described previously, with reference to FIG. 3, each signal measurement pair identifies sensors and sub-systems that lie along a path that originates and terminates at the pair of signal measurements respectively. Furthermore, each signal measurement pair drives a Kalman-filter corresponding to the path associated with the signal measurement pair.

The process then proceeds to step S920, wherein the Kalman-filter residual is computed for each signal measurement pair. The details regarding the computation of the residuals are described previously with reference to FIG. 2.

Further, in step S930, the process computes for each signal measurement pair, a binary value (referred to herein as a binary-detection value), for each sensor and sub-system lying on the path defined by the measurement pair. Based on the computed Kalman-filter residual value and a predetermined threshold, either a '1' or a '0' is assigned to the sensors and sub-systems lying on the path. As described previously, if the computed residual value is less than a predetermined threshold (corresponding to the path identified by the signal measurement pair), then all the sensors and sub-systems lying on the path are assigned a binary value of '0', indicating that none of the components (sensors and sub-systems) are faulty. However, if the computed residual value is higher than the predetermined threshold, then all the components (sensors and sub-systems) that lie on the path are assigned a binary value of '1', indicating that at least one of the components along the path is faulty.

The process further proceeds to step S940, wherein a fault in the sensor network is isolated by performing a logical-AND operation on the binary detection values (assigned in step S930) of the sensors and sub-systems in the network. According to an embodiment, a binary value that is computed by performing the logical-AND operation (referred to herein as a binary-decision value) indicates which component of the network is in a faulty state. Furthermore, specific details regarding the computations of the above steps are described previously with reference to FIG. 4.

Figure 10:
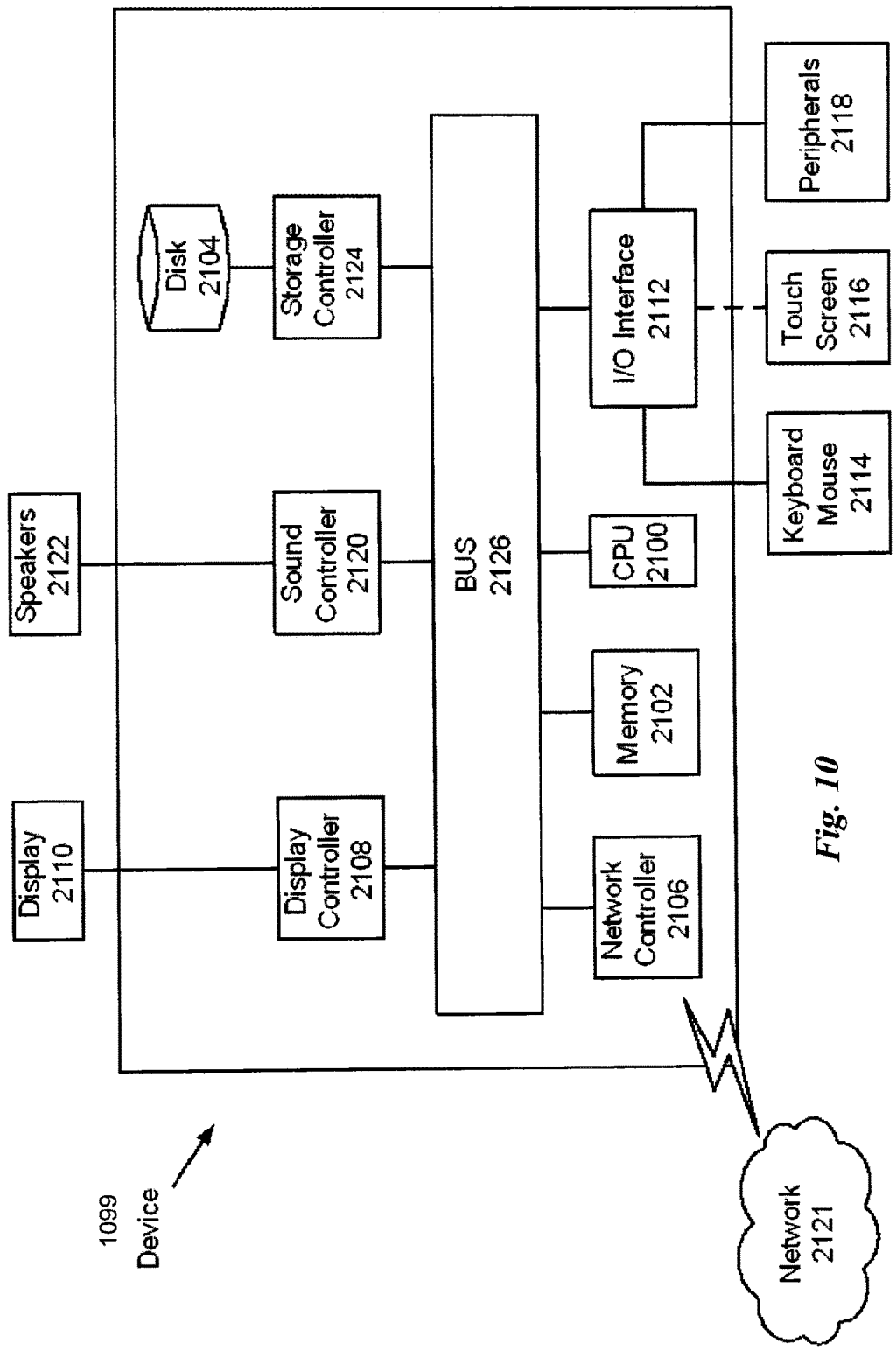
FIG. 10 illustrates a block diagram of a computing device according to an embodiment.

Additionally, each of the functions of the above described fault detection and isolation method may be implemented by a control circuitry, which includes one or more processing circuits. A processing circuit includes a programmed processor, for example, processor (central processing unit) 2100, as shown in FIG. 10. A processing circuit may also includes devices such as an application specific integrated circuit (ASIC) and conventional circuit components arranged to perform the recited functions.

In what follows, the salient features of the fault detection and isolation techniques described herein are re-iterated for sake for completeness.

With regard to the feature of detecting and isolating faults, the faults may be simple (a fault in only one subsystem) or multiple faults in subsystems (simultaneous faults in two or more subsystems), and the detection method further estimates fault size. The system is subject to disturbances and the output measurement is corrupted by noise. The measurements may be restricted to inputs and/or outputs of only some of the subsystems whose faults have to be detected and isolated (that is the inputs and/or the outputs of some subsystems may not be accessible). For example, a fault in a sensor, a controller, an actuator or a plant is to be detected and isolated even if the measurement is restricted only to the input and the output of the system. Bayes' decision strategy is employed to detect and isolate a fault. In this case influence vectors associated with each fault type (or the direction of each fault type) are computed during the identification phase and a fault type is determined from the maximum correlation between the KF residual and the hypothesized residual estimates.

For the case wherein measurements include all the inputs and/or the outputs of all the sub-systems whose faults have to be detected and isolated, a bank of Kalman filter may be utilized. For example, if fault in a sensor, a controller, an actuator and a plant is to be detected and isolated, then measurements must include the sensor output, the controller input and the output, the actuator inputs as well as the input and the output of the plant. Only the residuals from all the KFs are employed for fault detection and isolation. The influence vector (or fault direction) is not required, and hence is not estimated. Only the residuals from all the Kalman filters are employed for fault detection and isolation. Bayes' decision strategy is then used to assert the presence or absence of a fault. Bayes' decision strategy is simple, computationally efficient and gives a closed-form solution for the detection and isolation of both simple and multiple faults.

The residuals of the Kalman filters are generated from all possible pairs of (a) sensor measurements $\{y_i(k),y_j(k)\}$ with $y_i(k)$ as input and $y_j(k)$ as the desired output as well as (b) the reference input and measurements $\{r(k),y_j(k)\}$ with $r(k)$ as the input and $y_j(k)$ as the desired output. Furthermore, with regard to cross-checking the faults, a fault in a subsystem or in a sensor is cross-checked by analyzing different paths between sensor nodes, thereby increasing the reliability of the described detection and isolation scheme. Note that the key property of the KF is that 'the residual is a zero-mean white noise process with minimum variance if and only if there is no systemic and model mismatch errors and if there is model-mismatch, the residual will have an additive term indicating model mismatch.

The identified model used in the Kalman filter captures the dynamic and static behaviors of the system, not only at a given operating point but also over the entire operating regimes. Operating points are tracked by scheduling variables, which are measured in real time and include exogenous signals such as the set point, internal variables such as the velocity and power, environment variables such as the altitude, temperature, pressure and air speed. At each operating point, a linear model is identified using a reliable and accurate identification scheme.

The system is identified by perturbing the emulator parameters to mimic various likely operating scenarios (instead of the typical schemes that are based on identifying the nominal mode from a single experiment). The identified model is optimal in the sense that it captures the static and dynamic behavior of the system over a wide region around a given operating point.

The KF is designed by identifying a piecewise linear model to approximate the nonlinear system over the entire operating regime. The Kalman filter thus obtained is adaptive and piecewise linear. Further, it is adapted along the trajectory of the operating points using the scheduling variables. Unlike the extended Kalman filter, it is optimal at each operating point, simple, computationally efficient and does not suffer from convergence problems.

The status of the system including a) the performance, b) systemic error, c) model mismatch, and d) presence of a fault is monitored by exploiting the key property of the Kalman filter. Using the Bayes decision strategy, a test statistics and a threshold value is selected to assert the status of the system stated above. The test statistics is a function of the residual and depends upon the reference input to the system. Threshold values are selected to ensure a high probability of correct decision without exceeding an acceptable probability of false alarm.

The reliability, accuracy and optimality (variance of the residual is minimum) of the Kalman Filter is ensured if it satisfies the key property of the residual namely the residual is a zero mean white noise process. Following steps are taken if the key property of the Kalman filter is not met: (a) Online tuning: If there is a systemic error, the Kalman gain is tuned online to ensure that the residual is a zero mean white noise process, (b) Re-identify and re-design: if online tuning is not successful, then there is model mismatch. The constant term in the residual is analyzed to determine if there is a fault. If there is no fault, the system is re-identified and the Kalman filter is redesigned for the identified model, and (c) Fault accommodation: If there is a fault then the fault is accommodated. Furthermore, incipient faults can be accommodated in time before they grow large to cause performance degradation or in the extreme case a failure and a shutdown of the system.

Additionally, according to another embodiment, a soft sensor may be developed using the Kalman filter scheme described herein. Soft sensors are invaluable in industrial applications in which hardware sensors are either too costly to maintain or to physically access. Software-based sensors act as the virtual eyes and ears of operators and engineers looking to draw conclusions from processes that are difficult—or impossible—to measure with a physical sensor. With no moving parts, the soft sensor offers a maintenance-free method for fault diagnosis and process control. They are ideal for use in aerospace, pharmaceutical, process control, mining, ml and gas, and healthcare industries.

FIG. 10 illustrates a block diagram of a computing device according to an embodiment. In FIG. 10, the computer 1099 includes a CPU 2100 which performs the processes described above. The process data and instructions may be stored in memory 2102. These processes and instructions may also be stored on a storage medium disk 2104 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the system communicates, such as a server or computer.

Further, the claimed advancements may be provided as a utility application, background daemon, or component of an operating system, or combination thereof, executing in conjunction with CPU 2100 and an operating system such as Microsoft Windows 7, UNIX, Solaris, LINUX, Apple MAC-OS and other systems known to those skilled in the art.

CPU 2100 may be a Xenon or Core processor from Intel of America or an Opteron processor from AMD of America, or may be other processor types that would be recognized by one of ordinary skill in the art. Alternatively, the CPU 2100 may be implemented on an FPGA, ASIC, PLD or using discrete logic circuits, as one of ordinary skill in the art would recognize. Further, CPU 2100 may be implemented as multiple processors cooperatively working in parallel to perform the instructions of the inventive processes described above.

The computer 1099 in FIG. 10 also includes a network controller 2106, such as an Intel Ethernet PRO network interface card from Intel Corporation of America, for interfacing with network 2121. As can be appreciated, the network 2121 can be a public network, such as the Internet, or a private network such as an LAN or WAN network, or any combination thereof and can also include PSTN or ISDN sub-networks. The network 2121 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The computer 1099 further includes a display controller 2108, such as a NVIDIA GeForce GTX or Quadro graphics adaptor from NVIDIA Corporation of America for interfacing with display 2110, such as a Hewlett Packard HPL2445w LCD monitor. A general purpose I/O interface 2112 interfaces with a keyboard and/or mouse 2114 as well as a touch screen panel 2116 on or separate from display 2110. General purpose I/O interface also connects to a variety of peripherals 2118 including printers and scanners, such as an OfficeJet or DeskJet from Hewlett Packard.

A sound controller 2120 may also be provided in the computer 1099, such as Sound Blaster X-Fi Titanium from Creative, to interface with speakers/microphone 2122 thereby providing sounds and/or music. The speakers/microphone 2122 can also be used to accept dictated words as commands.

The general purpose storage controller 2124 connects the storage medium disk 2104 with communication bus 2126, which may be an ISA, EISA, VESA, PCI, or similar, for interconnecting all of the components of the robot-guided medical procedure system. A description of the general features and functionality of the display 2110, keyboard and/or mouse 2114, as well as the display controller 2108, storage controller 2124, network controller 2106, sound controller 2120, and general purpose I/O interface 2112 is omitted herein for brevity as these features are known.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

The invention claimed is:

1. A fault detection method for use with a flow sensor and a height sensor in a fluid tank sensor network including a plurality of sub-systems connected in a cascade, parallel and a feedback fashion, the method comprising:
   receiving, by a processing circuit, a plurality of signal measurement pairs in the sensor network, wherein each signal measurement pair corresponds to a path in the sensor network and at least one signal pair corresponds to a consecutive flow sensor and a height sensor pair, and drives a Kalman-filter corresponding to the path in the sensor network;
   computing, by the processing circuit, a Kalman-filter residual for each signal measurement pair, wherein the Kalman-filter residual indicates the presence of a fault on the path corresponding to the signal measurement pair, when the plurality of signal measurement pairs are associated with all of the plurality of sub-systems;
   assigning for each signal measurement pair, a binary-detection value for each sensor and sub-system lying on the path corresponding to the signal measurement pair, based on the computed Kalman-filter residual and a predetermined threshold corresponding to the signal measurement pair;
   computing, by the processing circuit, a binary-decision value for each sensor and sub-system in the sensor network, by performing a logical-AND operation of the assigned binary-detection values of the sensors and sub-systems;
   determining, by the processing circuit, a correlation between the Kalman-filter and hypothesized residual estimates when the plurality of signal measurement are associated with one or more sub-systems to be diagnosed;
   computing, by the processing circuit, influence vectors based on a maximum correlation; and
   diagnosing and isolating, by the processing circuit, one or more faults in the sensor network based on the influence vectors or the binary-decision value of each sensor.

2. The method of claim 1, wherein the signal measurement pair is one of a signal measurement pair including a reference signal and a sensor measurement, and a signal measurement pair including signal measurements obtained from consecutive sensors in the network.

3. The method of claim 2, wherein the processing circuit is configured to compute a transfer function of the Kalman-filter driven by a pair of consecutive sensor measurements as:

$$y_j(z) = \frac{k_{sj}}{k_{si}}\left(\prod_{l=i}^{j-1} G_l(z)\right) y_i(z) + v_{ij}(z),$$

and wherein, $y_i(z)$ and $y_j(z)$ are a pair of sensor measurements obtained from sensor i and sensor j, $k_{sj}$ and $k_{si}$ are the sensor gains of sensor i, and sensor j, respectively, $G_l(z)$ is transfer function of sub-system l that lies in the path from sensor i to sensor j, and $v_{ij}(z)$ is equivalent noise between sensor i and sensor j.

4. The method of claim 2, wherein the processing circuit is configured to compute a transfer function of the Kalman-filter driven by a pair of reference signal and a sensor measurement as:

$$y_j(z) = k_{sj} \left( \frac{\prod_{l=0}^{i} G_l(z) r(z)}{1 + \prod_{l=0}^{q-1} G_l(z)} \right) + v_{rj}(z)$$

wherein, r(z) is the reference signal, and $y_j(z)$ is the sensor measurement obtained from sensor j, $G_l(z)$ is transfer function of sub-system l that lies in the path from the reference signal input r(z) to sensor j, $k_{sj}$ is a sensor gain of sensor j, and $v_{rj}(z)$ is equivalent noise between reference signal and sensor j.

5. The method of claim 1, wherein the binary detection value for each sensor and sub-system lying on the path corresponding to the signal measurement pair is assigned a value of one, when the Kalman-filter residual of the signal measurement pair is greater than the predetermined threshold of the signal measurement pair.

6. The method of claim 1, wherein the binary detection value for each sensor and sub-system lying on the path corresponding to the signal measurement pair is assigned a value of zero, when the Kalman-filter residual of the signal measurement pair is less than the predetermined threshold of the signal measurement pair.

7. The method of claim 1, further comprising:
computing, by the processing circuit, an auto-correlation of the Kalman-filter residual for each signal measurement pair to indicate a presence of the fault in the path corresponding to the signal measurement pair.

* * * * *